US 8,675,360 B2

(12) United States Patent
Ohsawa et al.

(10) Patent No.: US 8,675,360 B2
(45) Date of Patent: Mar. 18, 2014

(54) OUTPUT DEVICE

(75) Inventors: Seiji Ohsawa, Kanagawa (JP);
Toshihide Ooba, Kanagawa (JP); Ooi Kok Hwa, Penang (MY); Cheng Wee Jian, Pulau Pinang (MY)

(73) Assignee: Sony Corporation, Tokyo (JP)

( * ) Notice: Subject to any disclaimer, the term of this patent is extended or adjusted under 35 U.S.C. 154(b) by 208 days.

(21) Appl. No.: 13/212,287

(22) Filed: Aug. 18, 2011

(65) Prior Publication Data

US 2012/0051020 A1   Mar. 1, 2012

(30) Foreign Application Priority Data

Aug. 26, 2010  (JP) ................. P2010-189536

(51) Int. Cl.
| H05K 7/02 | (2006.01) |
| G06F 1/16 | (2006.01) |
| H05K 5/00 | (2006.01) |
| H05K 7/00 | (2006.01) |
| H05K 7/16 | (2006.01) |
| B65D 85/00 | (2006.01) |

(52) U.S. Cl.
USPC ............. 361/679.58; 361/807; 361/679.41; 361/726; 361/732; 206/701

(58) Field of Classification Search
USPC ............ 361/807, 679.58, 726, 732, 679.55, 361/679.41; 206/320, 701
See application file for complete search history.

(56) References Cited

U.S. PATENT DOCUMENTS 7,046,508 B2 * 5/2006 Lin ...................... 361/679.59
7,255,228 B2 * 8/2007 Kim .......................... 206/320

FOREIGN PATENT DOCUMENTS

| JP | 10-236496 A | 9/1998 |
| JP | 2000-208959 A | 7/2000 |
| JP | 2000-332447 A | 11/2000 |
| JP | 2007-313020 A | 12/2007 |

* cited by examiner

*Primary Examiner* — Anthony M Haughton
*Assistant Examiner* — Zhengfu Feng
(74) *Attorney, Agent, or Firm* — Sony Corporation

(57) ABSTRACT

An output device which houses a portable device in an internal space and which outputs at least audio or images outputted from the housed portable device to the outside, includes: a case body including a housing portion housing the portable device; a lid body connected to the case body so as to pivot about a hinge portion and pivoted between an opened position in which the housing portion of the case body is opened and a closed position in which the housing portion of the case body is closed; and a pair of buckles pivotally supported at one outer peripheral portion of the case body or the lid body between a locked position and a lock release position as well as pivoted to the locked position when the lid body is pivoted to the closed position to thereby lock the lid body with respect to the case body.

4 Claims, 24 Drawing Sheets

OUTPUT DEVICE

CROSS-REFERENCE TO RELATED APPLICATION

The present application claims priority from Japanese Patent Application No. JP 2010-189536 filed in the Japanese Patent Office on Aug. 26, 2010, the entire content of which is incorporated herein by reference.

FIELD

The present disclosure relates to a technical field concerning an output device. In particular, the present disclosure relates to a technical field in which an output device having waterproof property is provided with a pair of buckles to thereby enable open and close of a lid body by simple operation for improving user-friendliness.

BACKGROUND

There exists an output device which houses a portable device such as a music reproduction device and an image reproduction device in an internal space and which outputs audio and images outputted from the housed portable device to the outside.

As one of the above output devices, there is one in which a lid body can be opened and closed with respect to a case body, a portable device is mounted in the internal space with the lid body in an opened state and the portable device is stored and held in the internal space by connecting the lid body to the case body for sealing the portable device (For example, refer to JP-A-2007-313020 (Patent Document 1).

In the output device described in Patent Document 1, for example, a speaker unit for outputting audio outputted from the portable device to the outside is provided at the case body. A window portion is formed in the lid body and a transparent operation unit cover having flexibility is attached so as to cover the window portion.

In a state in which the lid body is connected to the case body, three buckles pivotally supported at the case body are respectively pivoted and the pivoted buckles are respectively locked to the lid portion to allow the lid body to be locked with respect to the case body, as a result, the internal space is sealed for securing the waterproof property. In the state in which the lid body is locked with respect to the case body and the portable device is housed in the internal space, the operation unit cover is pressed onto the portable device and the portable device is held, therefore, and unnecessary movement of the portable device in the internal space is prevented.

When a user performs operation of an operation unit of the portable device with the operation unit cover from the outer surface side, for example, audio outputted from the portable device can be outputted to the outside.

SUMMARY

However, the output device described in Patent Document 1 has a structure in which a total of three buckles are provided at upper, right and left parts of the device and the three buckles are respectively pivoted to thereby lock the lid body with respect to the case body. Accordingly, there is a problem that it is difficult to lock the lid body by a single operation even when using both hands, which may lead to poor user-friendliness.

The output device also has the structure in which the lid portion is separated from the case body when the lid body is detached from the case body, therefore, there is also a problem that it is necessary to pivot the buckles to lock the lid body after the lid body is positioned with respect to the case body, therefore, the connection of the lid body to the case body is bothersome, which may also lead to poor user-friendliness.

In view of the above, it is desirable to provide an output device which can open and close the lid body with simple operation for improving user-friendliness.

An embodiment of the present disclosure is directed to an output device which houses a portable device in an internal space and which outputs at least audio or images outputted from the housed portable device to the outside includes a case body having a housing portion housing the portable device, a lid body connected to the case body so as to pivot about a hinge portion and pivoted between an opened position in which the housing portion of the case body is opened and a closed position in which the housing portion of the case body is closed and a pair of buckles pivotally supported at one outer peripheral portion of the case body or the lid body between a locked position and a lock release position as well as pivoted to the locked position when the lid body is pivoted to the closed position to thereby lock the lid body with respect to the case body, in which the internal space formed by the lid body and the case body is waterproofed in the state in which the lid body is pivoted to the closed position and the lid body is locked with respect to the case body by the pair of buckles, a pair of engaging portions to which the pair of buckles pivoted to the locked position are respectively engaged are provided at the other outer peripheral portion of the case body or the lid body, outer peripheries of the pair of buckles are formed to have a curved shape, and the pair of buckles supported at the case body or the lid body and the pair of engaging portions provided at the case body or the lid body are arranged at opposite positions so as to sandwich the housing portion.

Therefore, the pair of buckles are pivoted to the locked position in the state in which the lid body is pivoted to the closed position with the hinge portion as a fulcrum to thereby allow the lid body to be locked with respect to the case body in the output device.

In the above output device, it is preferable that the buckle is provided with a locking claw, the engaging portion is provided with a to-be-locked piece to which the locking claw is engaged, the engaging portion is provided with an operation rib which allows the buckle to pivot from the locked position to the lock release position so as to touch the locking claw when the lid body is pivoted from the opened position to the closed position in a state in which the buckle is pivoted to the locked position.

As the engaging portion is provided with the operation rib, the buckle is pivoted to the lock release position when the lid body is pivoted from the opened position to the closed position in the state in which buckle is pivoted to the locked position.

In the above output device, it is preferable that the buckle is provided with two locking claws, the engaging portion is provided with two to-be-locked pieces to which the two locking claws are engaged, and the two locking claws of the buckle are provided at both end portions of the buckle in the direction extending along the outer periphery of the buckle.

As the two locking claws of the buckle are provided at both end portions of the buckle in the direction extending along the outer periphery of the buckle, the locking claws of the buckles are engaged with the to-be-locked pieces of the lid body at a total of four points which are apart from one another in the circumferential direction of the case body.

In the above output device, it is preferable that the buckles are held in the lock release position when the lock of the lid body with respect to the case body is released.

As the buckles are held in the lock release position when the lock of the lid body with respect to the case body is released, the lid body does not touch the buckles when the lid body is pivoted from the opened position toward the closed position.

In the above output device, it is preferable that a grasping recess is formed in the buckle to which a user sets a finger.

As the grasping recess is formed in the buckle to which the user sets a finger, the buckle is pivoted from the locked position to the lock release position by operating the grasping recess.

The output device according to the embodiment of the present disclosure which houses a portable device in an internal space and which outputs at least audio or images outputted from the housed portable device to the outside includes a case body including a housing portion housing the portable device, a lid body connected to the case body so as to pivot about a hinge portion and pivoted between an opened position in which the housing portion of the case body is opened and a closed position in which the housing portion of the case body is closed, and a pair of buckles pivotally supported at one outer peripheral portion of the case body or the lid body pivot between a locked position and a lock release position as well as pivoted to the locked position when the lid body is pivoted to the closed position to thereby lock the lid body with respect to the case body, in which the internal space formed by the lid body and the case body is waterproofed in the state in which the lid body is pivoted to the closed position and the lid body is locked with respect to the case body by the pair of buckles, a pair of engaging portions to which the pair of buckles pivoted to the locked position are respectively engaged are provided at the other outer peripheral portion of the case body or the lid body, outer peripheries of the pair of buckles are formed to have a curved shape, and the pair of buckles supported at the case body or the lid body and the pair of engaging portions provided at the case body or the lid body are arranged at opposite positions so as to sandwich the housing portion.

Accordingly, the lock of the lid body with respect to the case body can be performed and released by a single operation using both hands, which improves user-friendliness of the output device.

The case body and the lid body are connected by the hinge portion and the lid body is not separated from the case body even in the state in which the lid body is in the opened position, therefore, it is not necessary to perform the lock of the lid body with respect to the case body after positioning the lid body to the case body, which can further improve user-friendliness.

According to the embodiment of the present disclosure, the buckle is provided with a locking claw, the engaging portion is provided with a to-be-locked piece to which the locking claw is engaged, the engaging portion is provided with an operation rib which allows the buckle to pivot from the locked position to the lock release position so as to touch the locking claw when the lid body is pivoted from the opened position to the closed position in a state in which the buckle is pivoted to the locked position.

The lid body is pivoted from the opened position to the closed position even in the state in which the buckle is pivoted to the locked position, therefore, the buckle is pivoted to the lock release position by the operation rib and smooth pivot operation of the lid body can be secured.

According to the embodiment of the present disclosure, the buckle is provided with two locking claws, the engaging portion is provided with two to-be-locked pieces to which the two locking claws are engaged, and the two locking claws of the buckle are provided at both end portions of the buckle in the direction extending along the outer periphery of the buckle.

The locking claws of the buckles are engaged with the to-be-locked pieces of the lid body at a total of four points which are apart from one another in the circumferential direction of the case body, therefore, the locked state of the lid body with respect to the case body can be stabilized as well as good waterproof property can be secured.

According to the embodiment of the present disclosure, the buckles are held in the lock release position when the lock of the lid body with respect to the case body is released.

Therefore, the lid body does not touch the buckles and smooth pivot operation of the lid body can be secured.

According to the embodiment of the present disclosure, a grasping recess is formed in the buckle to which the user sets a finger.

Therefore, the holding of the output device and operation with respect to the buckle by the user can be easily performed, which can improve user-friendliness of the output device.

DETAILED DESCRIPTION

Hereafter, the best mode for carrying out the present disclosure will be explained with reference to the attached drawings.

An output device according to an embodiment of the present disclosure is, for example, a device outputting audio and images outputted from a portable device housed in an internal space to the outside, which includes a case body and a lid body connected to the case body so as to pivot about a hinge portion.

In the following explanation, directions are shown in a normal use state of the output device for convenience of explanation. The side where the case body is positioned is assumed to be the back and the side where the lid body is positioned is assumed to be the front in a state in which the portable device is housed in the internal space. Directions are also shown on the assumption that the hinge portion is positioned on a lower side and speaker units are positioned right and left.

The directions of up, down, front, back, left and right which will be described below are shown for convenience of explanation, and the present technology is not exclusively applied to these directions.

<Structure of an Output Device>

An output device 1 has a structure in which a case body 2 and a lid body 3 are connected through a hinge portion provided at a lower end portion, and the lid body 3 can pivot with respect to the case body 2 about the hinge portion 4.

Figure 1:
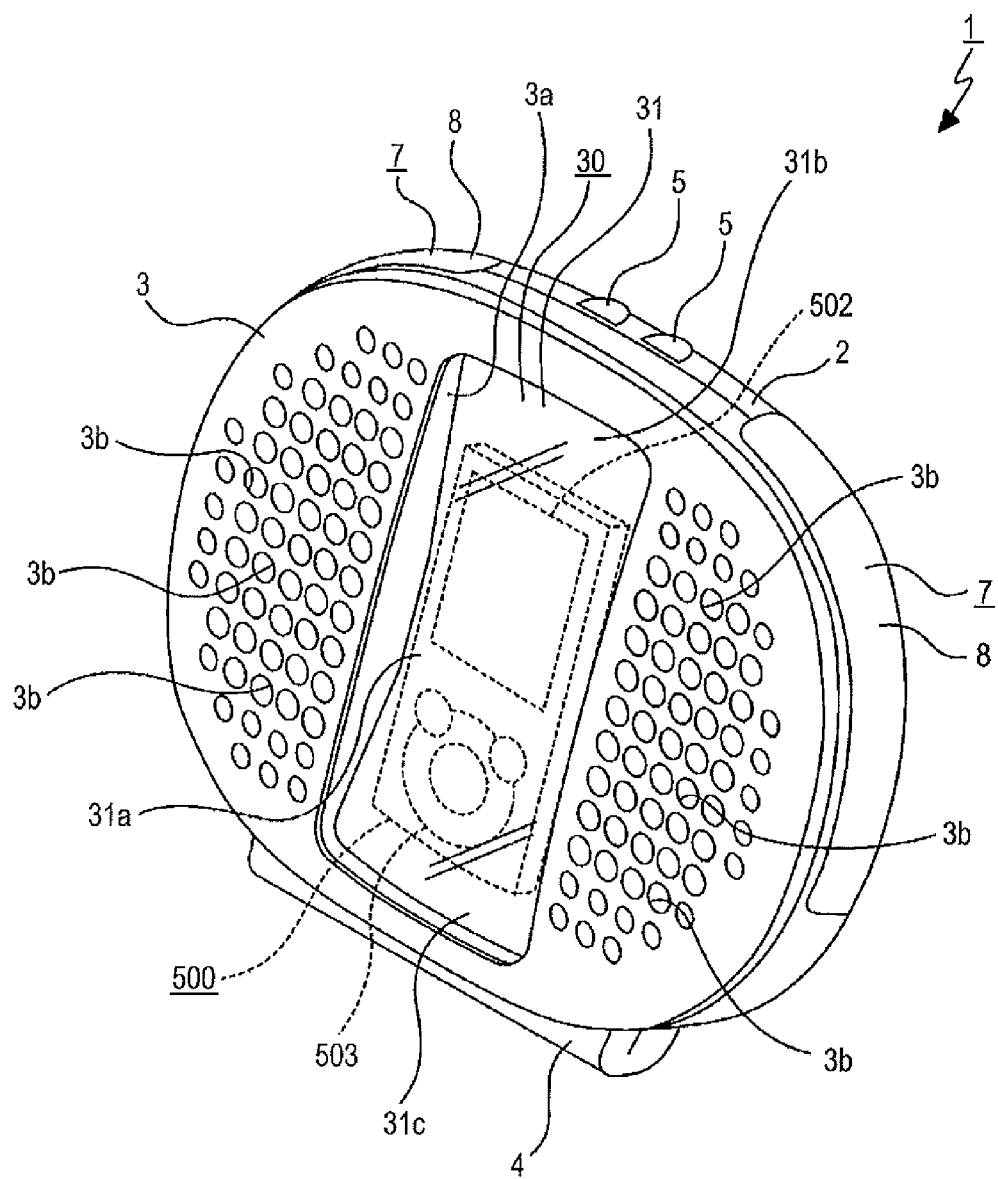
FIG. 1 is a perspective view showing an output device.
Figure 2:
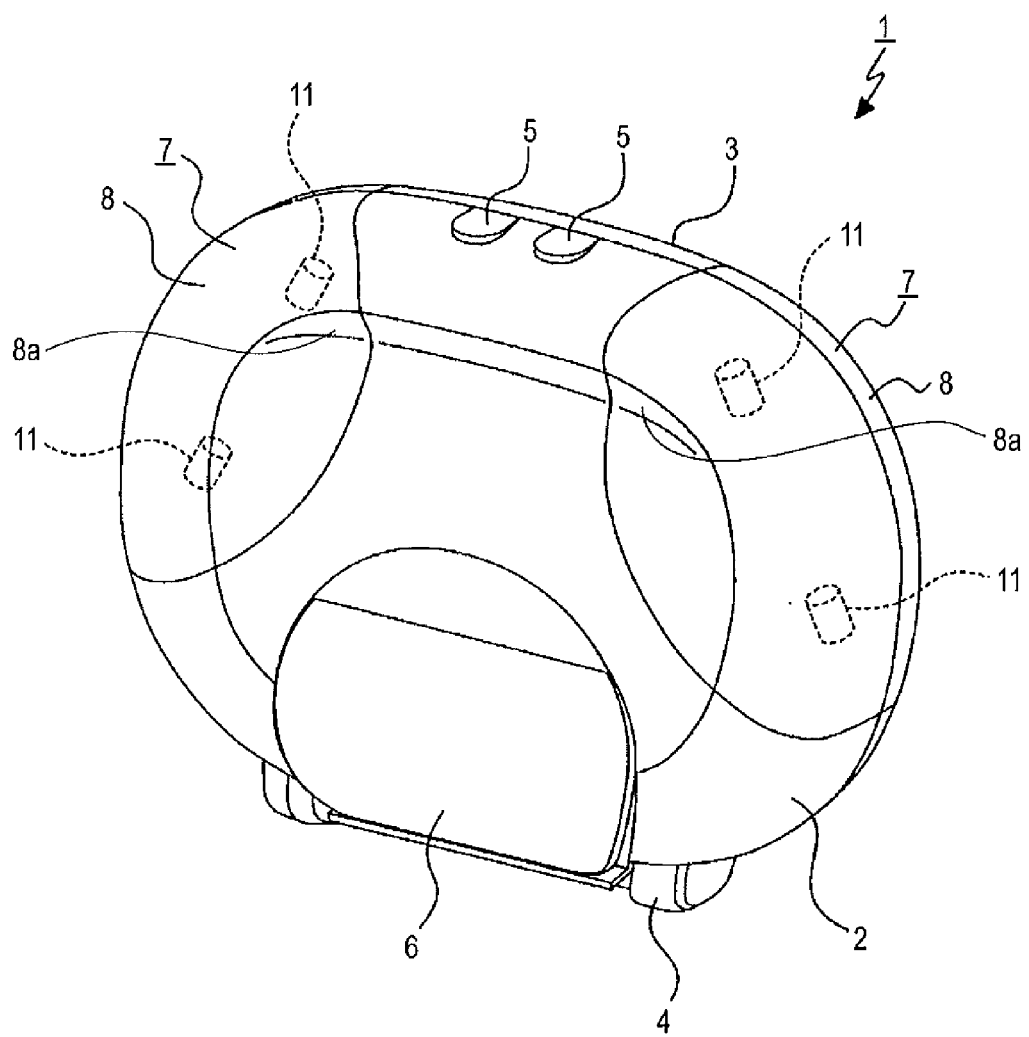
FIG. 2 is a perspective view showing the output device in a state seen from the opposite direction to FIG. 1.

The case body 2 is formed to have, for example, an outer shape of rather oval in landscape orientation, and a portion ranging from an outer circumferential surface to an outer peripheral portion of a back surface is formed in a curved surface which is convex outward (refer to FIG. 2). On an upper surface of the case body, operation buttons 5, 5 are arranged right and left so as to be apart from each other (refer to FIG. 1 and FIG. 2). The operation buttons 5, 5 function as, for example, volume adjustment buttons for adjusting volume of audio outputted from a later-described portable device.

Figure 5:
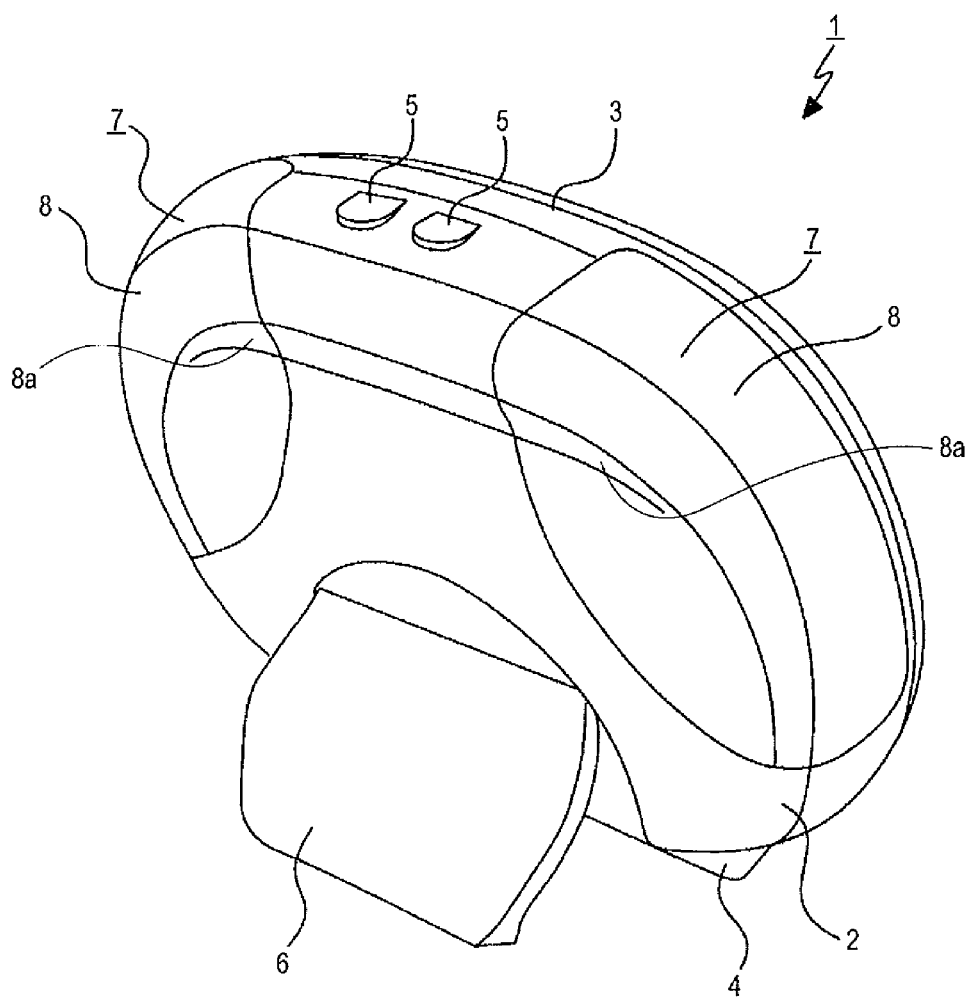
FIG. 5 is a perspective view showing the output device in a state in which buckles are in a locked position.

At a lower end portion of the case body 2 on the back side, a supporting stand 6 is pivotally connected (refer to FIG. 2). An upper end portion of the supporting stand 6 is connected to the case body 2. The output device 1 can be placed in a standing state by pivoting the supporting stand 6 to be pulled out from the case body 2 (refer to FIG. 5).

Figure 6:
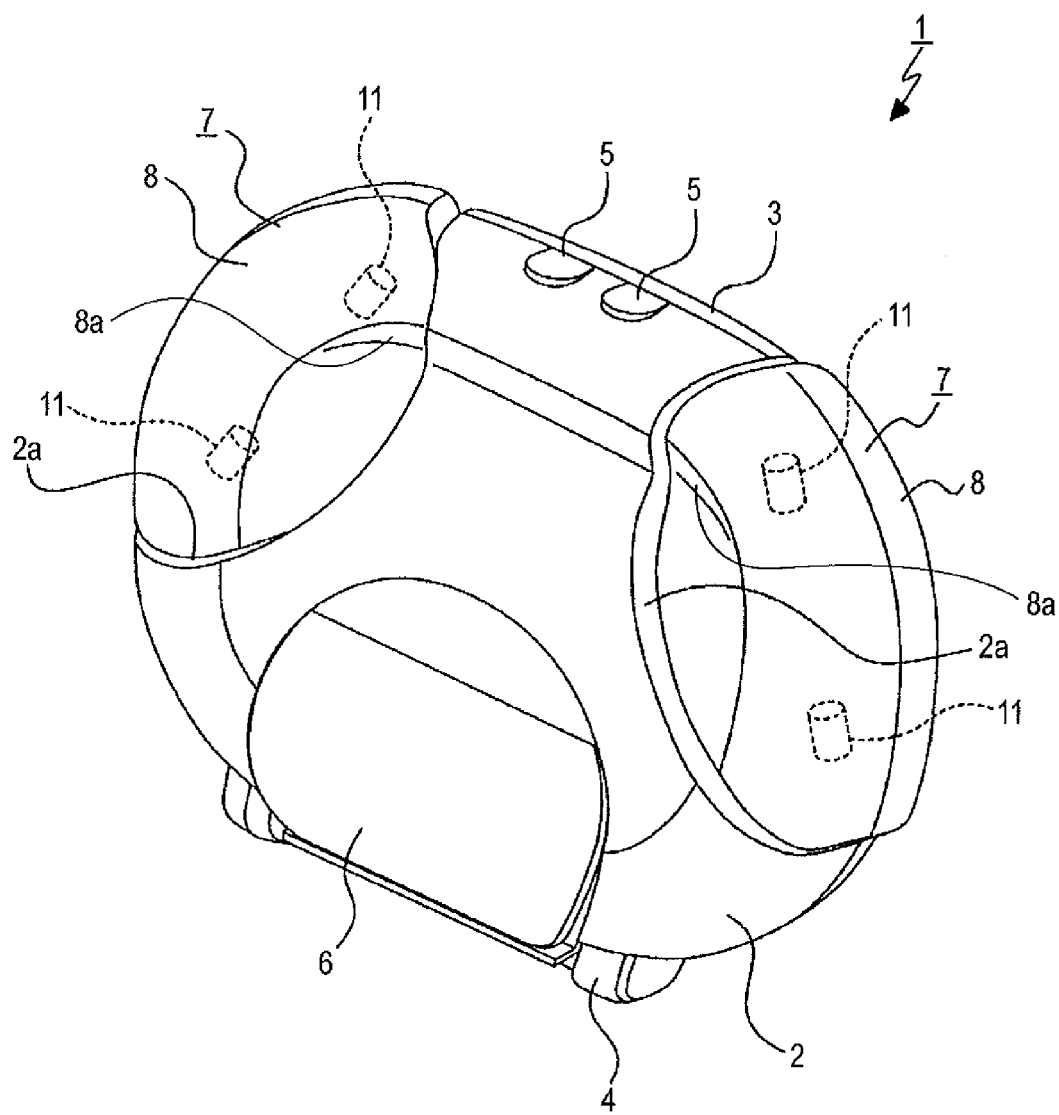
FIG. 6 is a perspective view showing the output device in a state in which the buckles are in a lock release position.

At right and left portions on both sides of the case body 2 on the upper side, shallow cutout portions for arrangement 2a, 2a are formed (refer to FIG. 6). Buckles 7, 7 are pivotally supported at right and left portions on both sides of the case body 2 respectively on the upper side. The buckles 7, 7 can pivot between a locked position (refer to FIG. 1 and FIG. 2) and a lock release position (refer to FIG. 4 and FIG. 6), and portions other than front end portions are housed in the cutout portions for arrangement 2a, 2a respectively in the locked position.

The buckle 7 includes a body 8, locking claws 9, 9 protruding inward from upper-and-lower both end portions (both end portions in a circumferential direction) in the front end portion of the body 8 and fulcrum shaft portions 11, 11 provided on the inner surface side of the body 8, which are integrally formed (refer to FIG. 4, FIG. 7, FIG. 8 and FIG. 9).

The body 8 is formed in a thin shape extending along the shape of the case body 2, in which an outer surface other than the back surface is formed to have a curved surface. On the back surface of the body 8, a grasping recess 8a for setting a finger 100, for example, a thumb of a user is formed (refer to FIG. 10).

Figure 8:
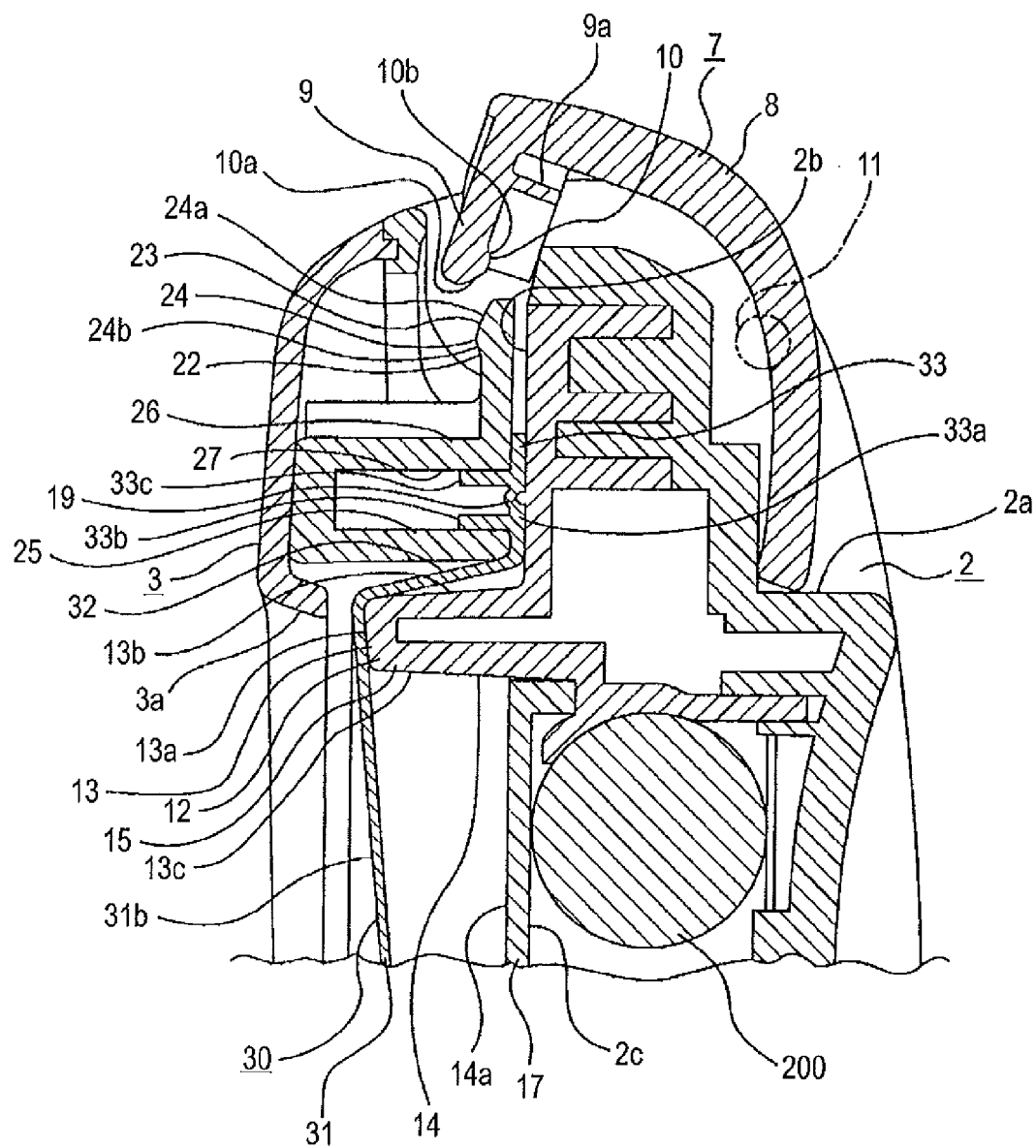
FIG. 8 is an enlarged cross-sectional view in a state in which the buckle is in the lock release position.
Figure 9:
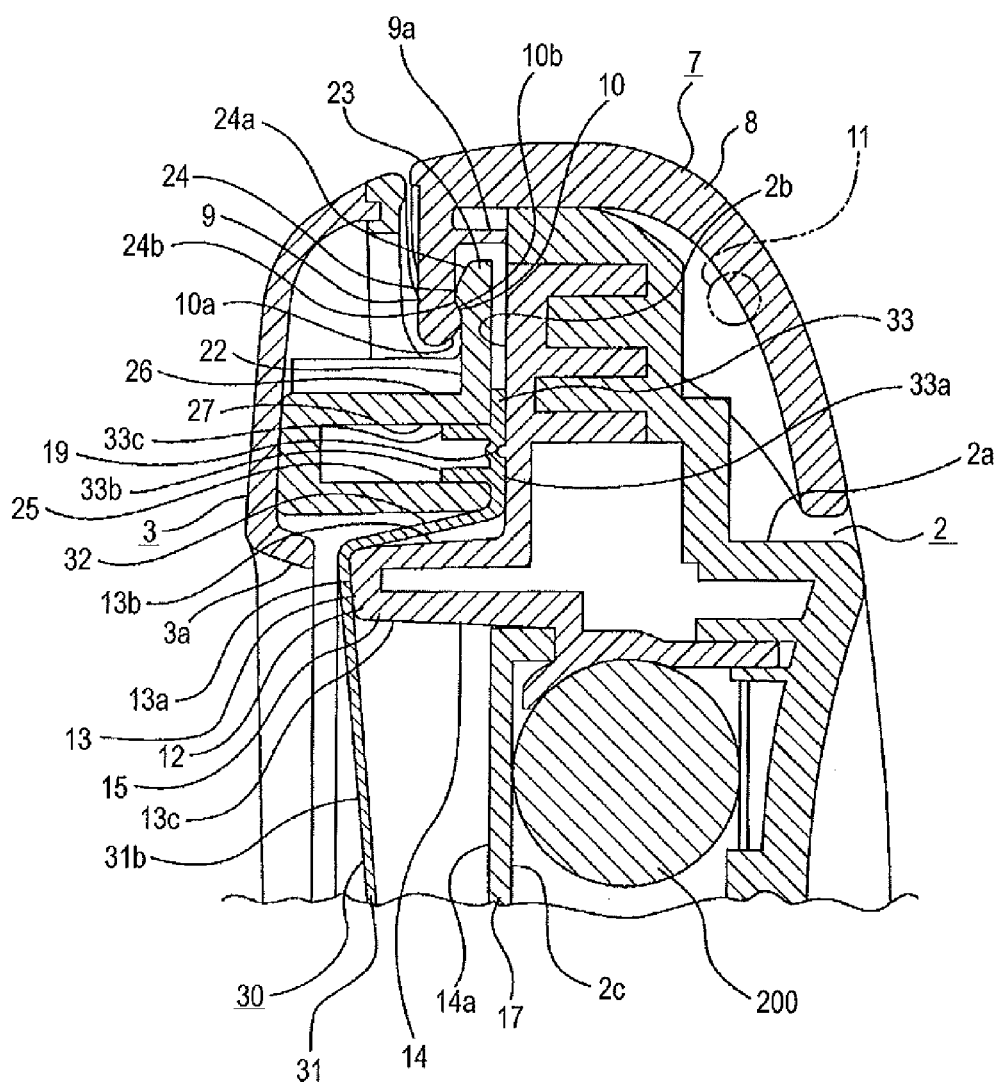
FIG. 9 is an enlarged cross-sectional view in a state in which the buckle is in the locked position.

The locking claw 9 is formed in a triangular shape so as to be elastically deform with respect to the body 8, in which an locking protrusion 10 protruding backward is provided at a back surface of a tip portion (refer to FIG. 8 and FIG. 9). The locking protrusion 10 includes a first inclined surface 10a positioned at the tip portion side and inclining so as to be displaced backward as coming close to the body 8 and a second inclined surface 10b continuing from the first inclined surface 10a and inclining so as to be displaced forward as coming close to the body 8. The locking claw 9 is provided with a reinforcing rib 9a protruding backward at a portion close to the body 8.

The fulcrum shaft portions 11, 11 are provided apart from each other in an axial direction, which function as pivot fulcrums of the buckle 7 with respect to the case body 2 and are provided at positions close to the back end of the body 8 (refer to FIG. 2). Therefore, the buckle 7 is formed to be heavier at a portion in front of the pivot fulcrums 11, 11 than a portion behind the pivot fulcrums 11, 11. When the case body 2 is inclined to be positioned lower than the lid body 3 in a state in which external force is not given to the buckle 7, the buckle 7 easily pivots from the locked position to the lock release position by the own weight.

The buckles 7, 7 are positioned so that outer surfaces continue to an outer surface of the case body 2 (refer to FIG. 5 and FIG. 9) in the state of the locked position and are positioned so that front end portions are positioned on the outer side of the outer surface of the case body 2 in the state of the lock release position (refer to FIG. 6 and FIG. 8).

Figure 4:
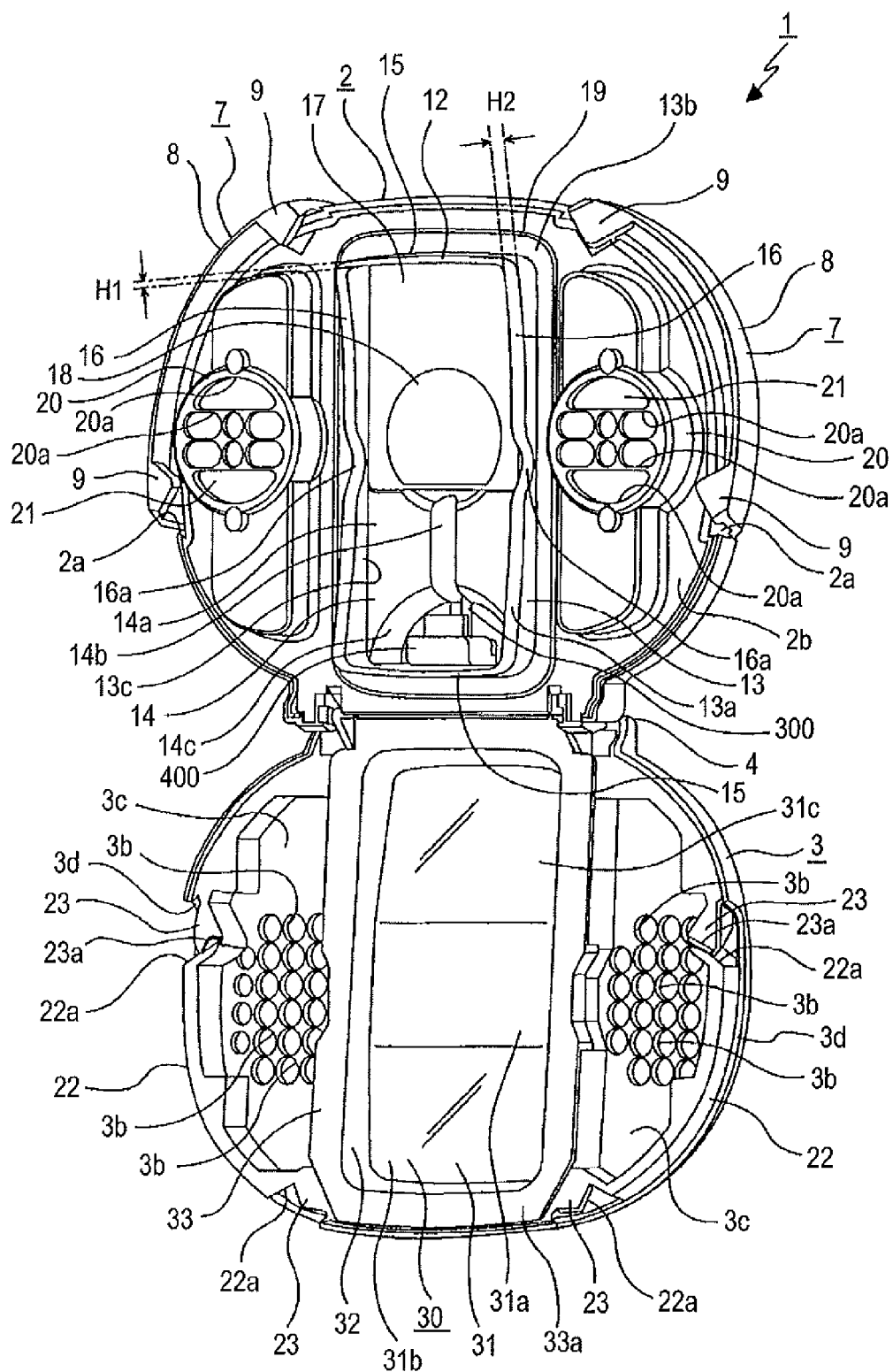
FIG. 4 is a perspective view showing the output device in a state in which the lid body is in an opened position.
Figure 7:
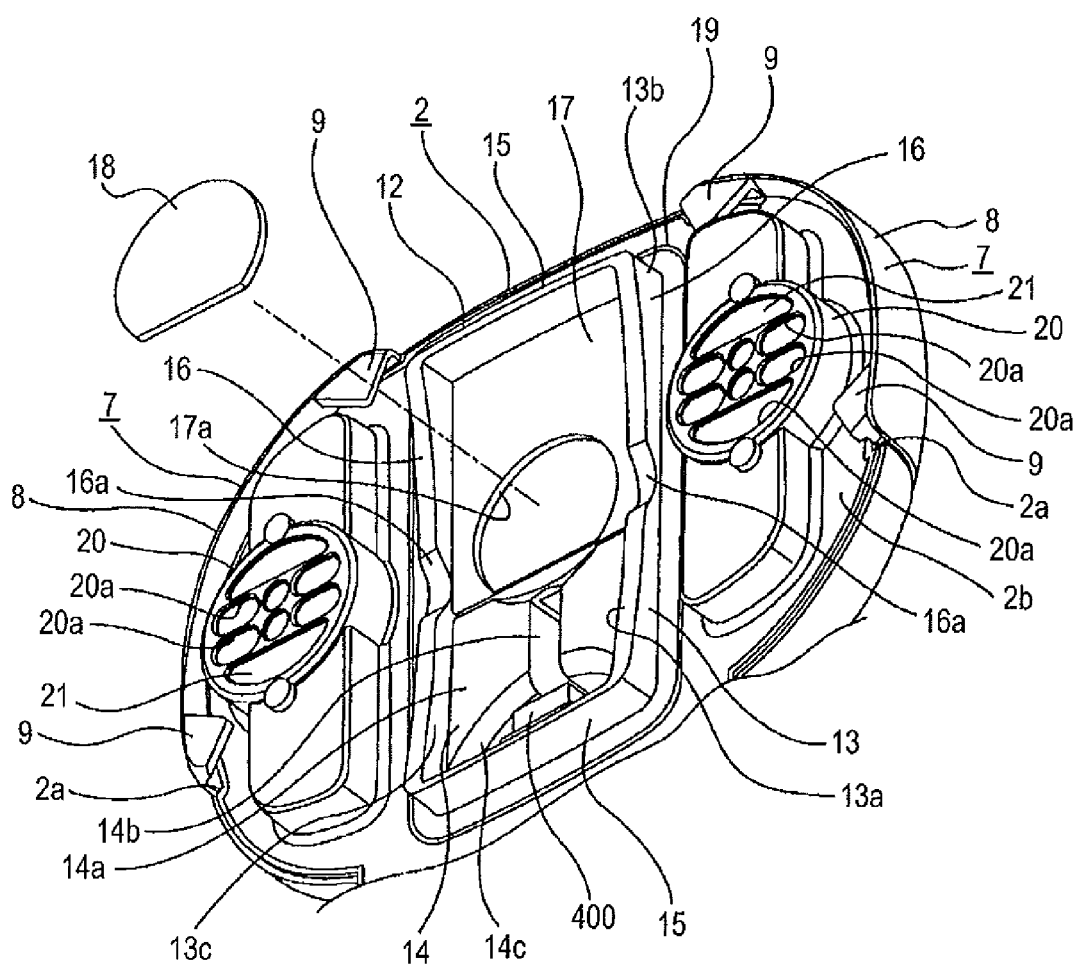
FIG. 7 is a perspective view showing a case body in a state in which a nonslip sheet is separated.

On a front surface 2b of the case body 2, a housing portion 12 is provided at the center in the right and left direction (refer to FIG. 4 and FIG. 7). A housing rib 13 formed to have an approximately rectangular-frame shape in portrait orientation is provided in the housing portion 12 and the inside of the housing rib 13 is formed as a housing recess 14.

The housing rib 13 includes first restriction walls 15, 15 positioned vertically apart from each other and extending right and left and second restriction walls 16, 16 positioned horizontally apart from each other and extending above and below.

The housing rib 13 includes an edge surface 13a whose outer surface faces the front, an outer peripheral surface 13b continuing from an outer edge of the edge surface 13a and an inner peripheral surface 13c continuing from an inner edge of the edge surface 13a. At the center of the second restriction walls 16, 16 in the vertical direction, recesses for removal 16a, 16a are respectively formed. The recesses for removal 16a, 16 are communicated with the housing recess 14 and the edge surface portion 13a is formed in an approximately arc shape which is convex backward.

In the housing rib 13, a width of the edge surface 13a of the first restriction walls 15, 15 (a width H1 of an upper and lower edges) is formed to be smaller than a width of the edge surface 13a of the second restriction walls 16, 16 (a width H2 of right and left edges) as shown in FIG. 4.

The width H1 of the edge surface 13a of the first restriction walls 15, 15 is formed to be smaller as described above, thereby reducing the size of the housing rib 13 in the longitudinal direction which is the vertical direction to the minimum and miniaturizing the output device 1.

Concerning spaces between the inner peripheral surface 13c of the housing rib 13 and an outer peripheral surface of a portable device 500 (refer to FIG. 11), spaces between the portable device 500 and the second restriction walls 16, 16 in the right and left direction are liable to be smaller than spaces between the portable device 500 and the first restriction walls 15, 15 in the vertical direction when considering the size of the portable device 500. Therefore, it is more likely that contact occurs between the portable device 500 and the second restriction walls 16, 16 than between the device and the first restriction walls 15, 15. The width H2 of the edge surface 13a in the second restriction walls 16, 16 is formed to be larger, rigidity of the second restriction walls 16, 16 can be increased to thereby prevent damage occurring when the portable device 500 touches the walls.

The housing recess 14 is formed by the inner peripheral surface 13c of the housing rib 13 and a placing surface 14a facing the front as a bottom surface (refer to FIG. 4 and FIG. 7).

The case body 2 is provided with a battery mounting portion 2c (refer to FIG. 8 and FIG. 9), and the battery mounting portion 2c is closed by a battery lid 17 (refer to FIG. 7 to FIG. 9). The battery lid 17 is arranged at an approximately upper half portion of the housing recess 14, and a front surface of the battery lid 17 is formed as part of the placing surface 14a. The user can mount batteries 200, 200 . . . in the battery mounting portion 2c by opening the battery lid 17.

A shallow attachment recess 17a opening to the front is formed at the battery lid 17 (refer to FIG. 7). A nonslip sheet 18 made of rubber materials such as silicon rubber is attached to the attachment recess 17a of the battery lid 17. Arrangement of the nonslip sheet 18 to the housing recess 14 prevents slipping of the portable device 500 to be housed in the housing recess 14, which provides stability of a housing state of the portable device 500 in the housing recess 14.

In the housing recess 14, a cable arrangement groove 14b opening to the front and a connector arrangement groove 14c opening to the front are continuously formed in the vertical direction at a lower side of the battery lid 17.

A cable 300 is arranged in the cable arrangement groove 14b, and one end of the cable 300 is connected to a not-shown circuit substrate arranged inside the case body 2. The other end of the cable 300 is connected to a connector 400, which is arranged in the connector arrangement groove 14c.

Figure 11:
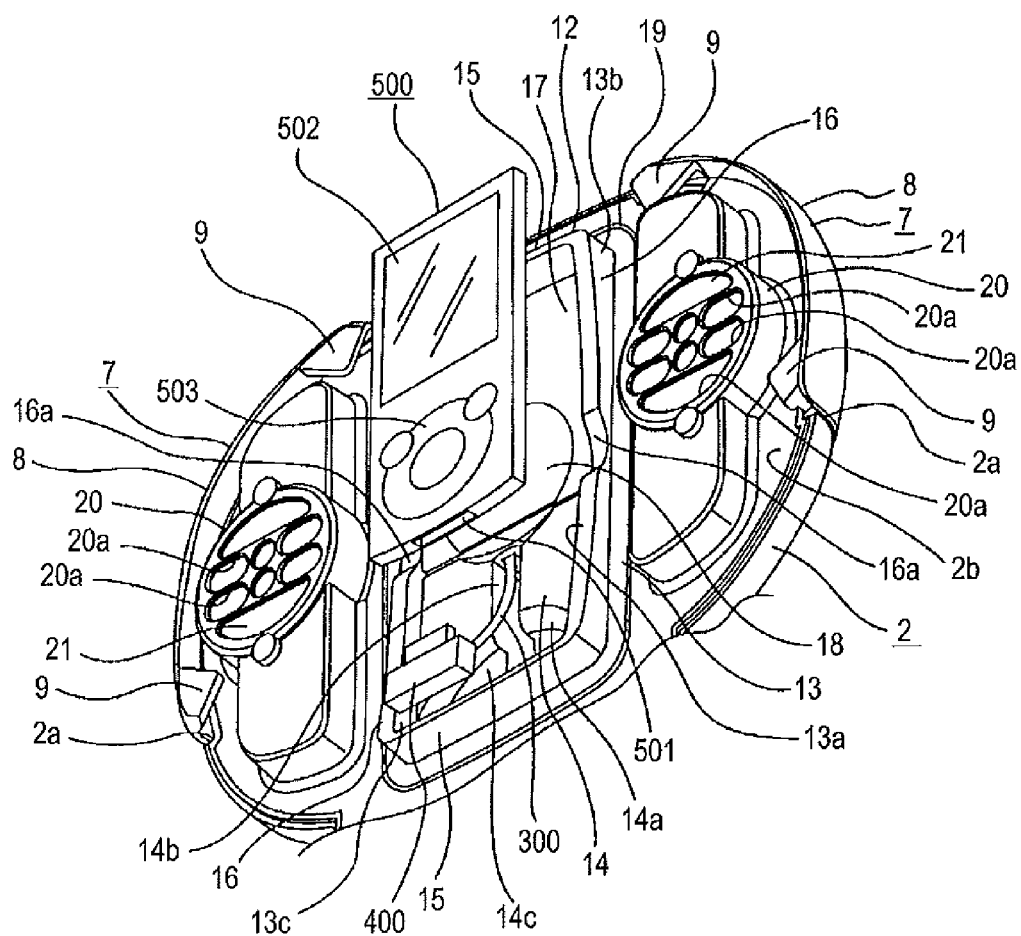
FIG. 11 is a perspective view showing the case body with the portable device.

The connector 400 and the cable 300 can be pulled out to the front from the connector arrangement groove 14c and the cable arrangement groove 14b respectively (refer to FIG. 11). The connector 400 and the cable 300 are pulled out to thereby connect the connector 400 to a connection terminal portion 501 of the portable device 500 easily.

On the outer periphery side of the housing rib 13 in the front surface 2b of the case body 2, a frame-shaped waterproof rib 19 is provided. An amount of protrusion of the waterproof rib 19 from the case body 2 is small, which is formed to have an approximately rectangular shape in portrait orientation.

In the front surface 2b of the case body 2, speaker arrangement portions 20, 20 are respectively provided so as to protrude forward at right and left of the housing portion 12. Output holes 20a, 20a, . . . , for outputting audio are formed in the speaker arrangement portions 20, 20. Respective units for outputting audio such as speakers 21, 21 and an amplifier circuit are respectively arranged inside the speaker arrangement portions 20, 20.

In the output device 1, the output holes 20a, 20a, . . . are communicated with the inside of the case body 2, however, a not-shown waterproof structure for preventing infiltration of moisture to respective units arranged inside the case body 2 through the output holes 20a, 20a, . . . is provided inside the case body 2.

The lid body 3 is formed to have an outer shape of rather oval in landscape orientation like the case body 2, and a portion ranging from an outer circumferential surface to an outer peripheral portion at a front surface is formed in a curved surface which is convex outward (refer to FIG. 1).

A window portion 3a piercing in the front and back direction is formed at the center of the lid body 3 in the right and left direction, and the window portion 3a is formed to have approximately the same size and shape as the outer shape of the housing rib 13 of the case body 2.

Audio output holes 3b, 3b, . . . are formed in the lid body 3 at right and left of the window portion 3a. On a back surface side of the lid body 3, recesses 3c, 3c opening to the back are formed at right and left of the window portion 3a and the audio output holes 3b, 3b, . . . are communicated with the recesses 3c, 3c as shown in FIG. 4.

Shallow cutout portions 3d, 3d are formed at right-and-left portions of both sides of the lid body 3 on the upper side as shown in FIG. 4, FIG. 8 and FIG. 9, and the portions where the cutout portions 3d, 3d are formed in the lid body 3 are provided as engaging portions 22, 22 respectively.

At upper-and-lower both end portions of the engaging portion 22 (both end portions in the circumferential direction), to-be-locked pieces 23, 23 protruding outward are provided respectively. Tips of the to-be-locked pieces 23, 23 are positioned on an inner side of the outer circumferential surface of the lid body 3.

Figure 12:
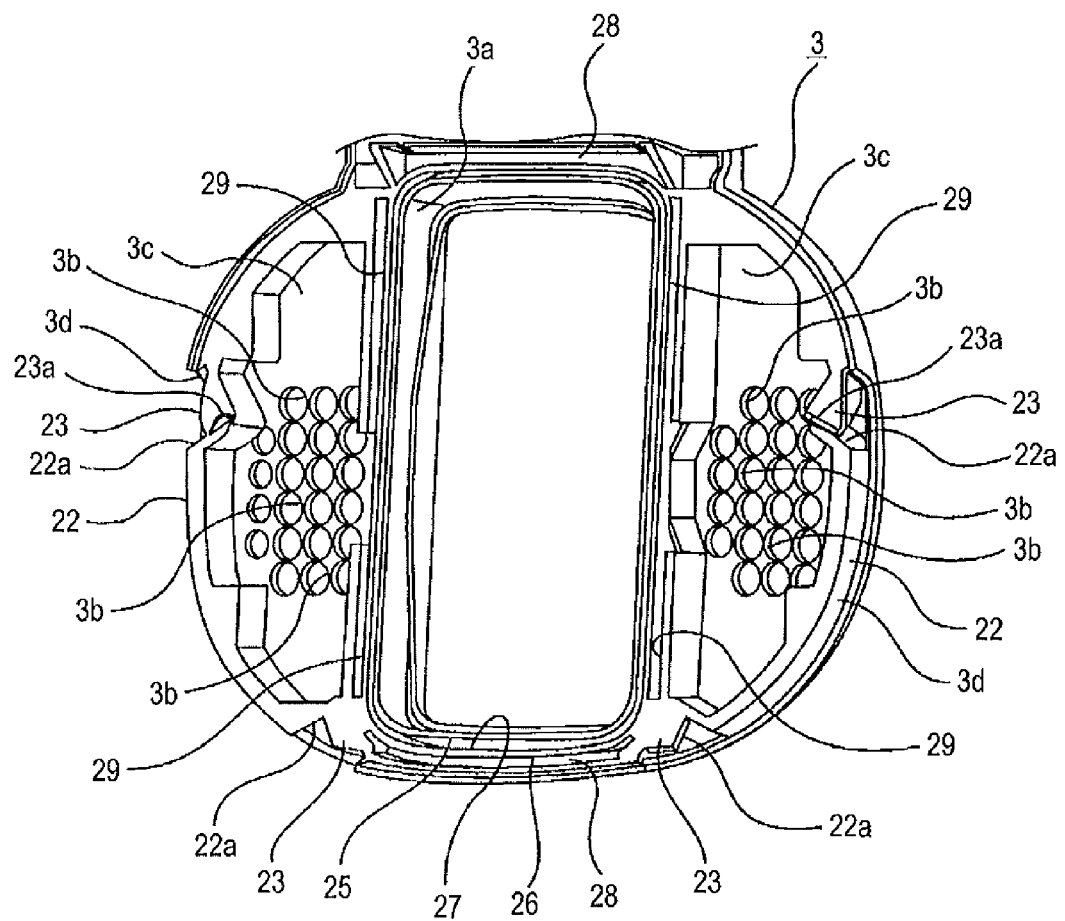
FIG. 12 is a perspective view of a lid body.

In the engaging portion 22, triangular clearance cutouts 22a, 22a, . . . opening outward are respectively formed at portions adjacent to the to-be-locked pieces 23, 23 (refer to FIG. 12).

The to-be-locked piece 23 can be elastically deformed, and a to-be-locked protrusion 24 protruding forward is provided at a front surface of a tip portion (refer to FIG. 8 and FIG. 9). The to-be-locked protrusion 24 includes a first inclined surface 24a positioned on the tip side and inclining so as to be displaced forward as drawing away from the tip and a second inclined surface 24b continuing from the first inclined surface 24a and inclining so as to be displaced backward as drawing away from the tip.

Figure 3:
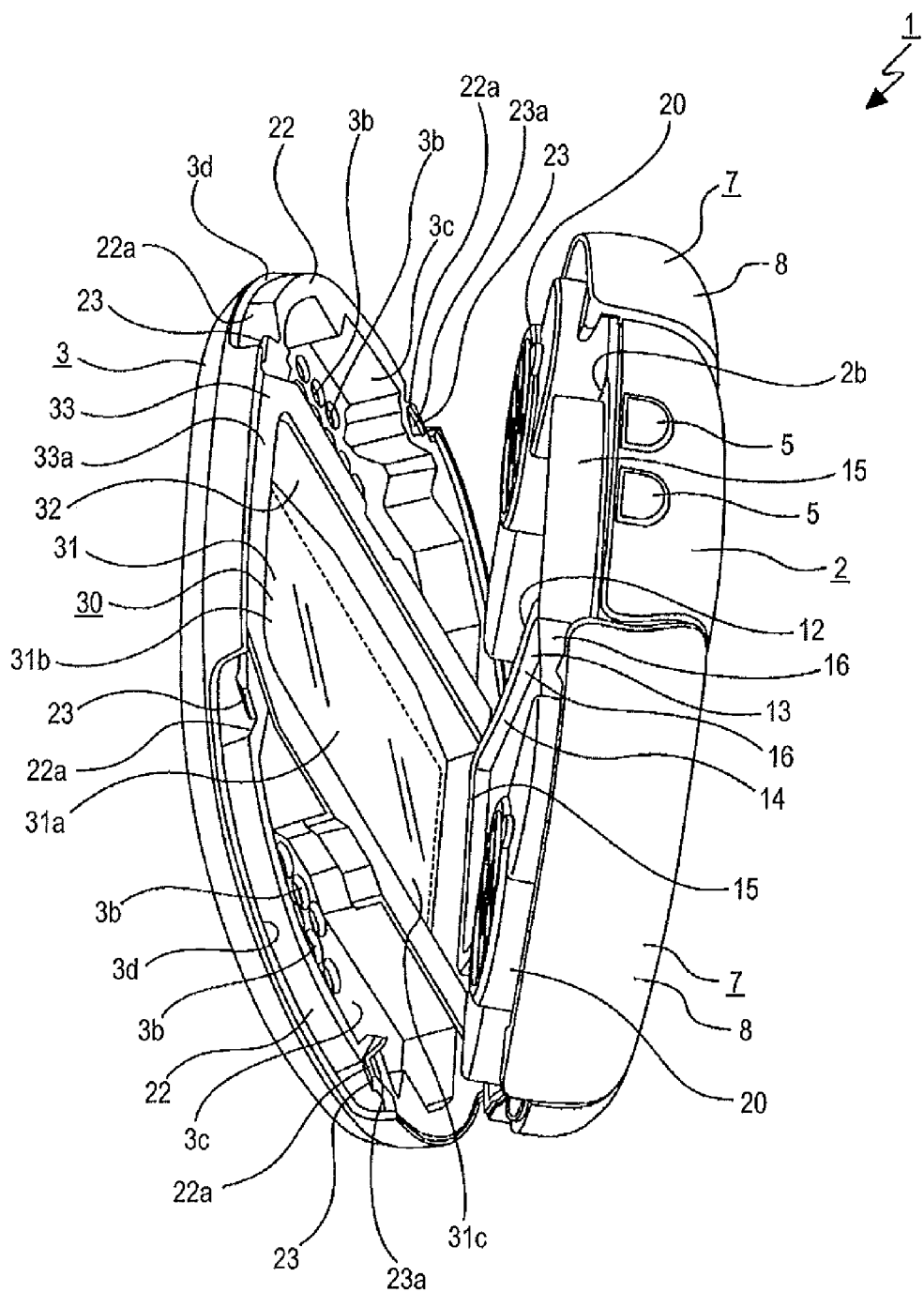
FIG. 3 is a perspective view showing the output device in a state in which a lid body is opened.

On rear surfaces of two to-be-locked pieces 23, 23 positioned at, for example, the lower side in the to-be-locked pieces 23, 23, . . . , operation ribs 23a, 23a protruding backward are respectively formed (refer to FIG. 3 and FIG. 4). The operation rib 23a is formed in an approximately triangular shape in which the protrusion amount thereof is increased as coming inside.

On the back side of the lid body 3, an inner wall portion 25 and an outer wall portion 26 having a frame shape are provided at the outer circumferential side of the window portion 3a, and the outer wall portion 26 is provided apart from the outer peripheral side of the inner wall portion 25 with a certain clearance as shown in FIG. 12. The clearance between the inner wall portion 25 and the outer wall portion 26 is formed as a holding groove 27 opens to the back.

On the back side of the lid body 3, first attachment grooves 28, 28 are formed above and below the outer wall portion 26. The first attachment grooves 28, 28 respectively extend in the right and left direction and open to the back. Additionally, second attachment grooves 29, 29, . . . are formed on the right and left sides of the outer wall portion 26 on the back side of the lid body 3, the second attachment grooves 29, 29, . . . respectively extend in the vertical direction and open to the back.

Figure 13:
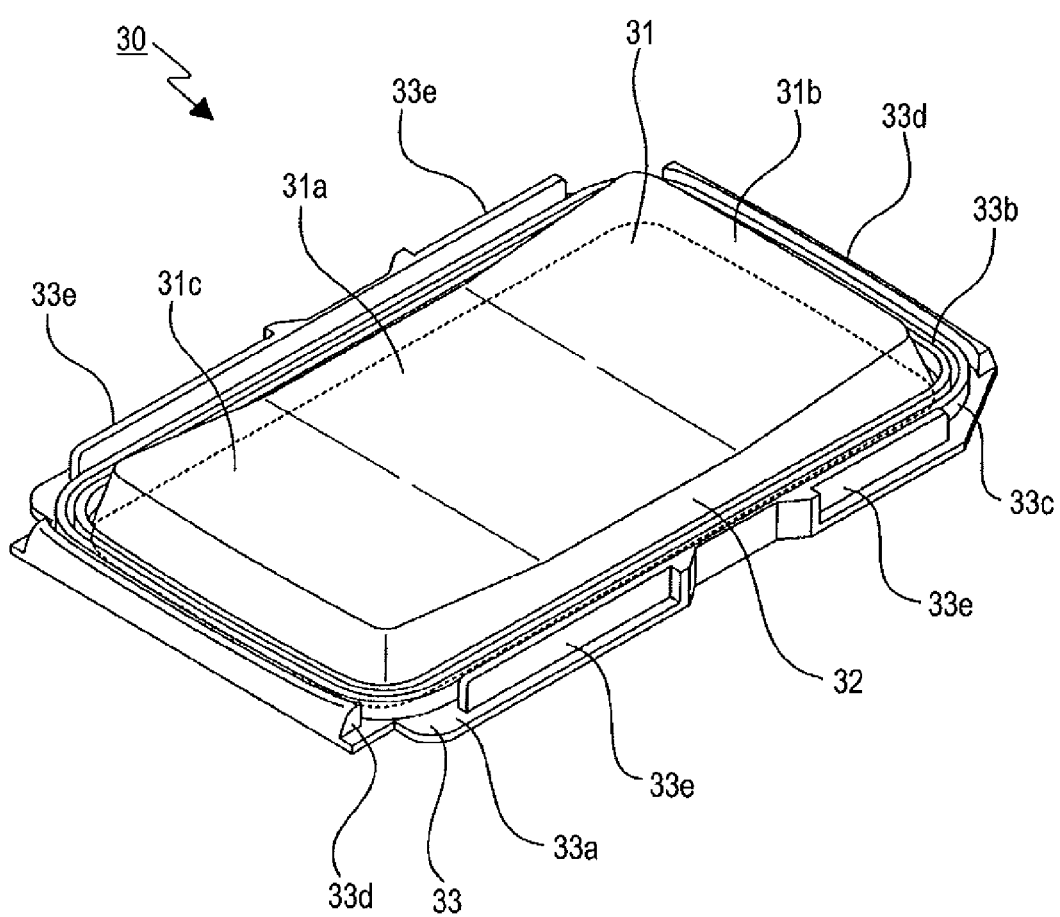
FIG. 13 is an enlarged perspective view of an operation unit cover.
Figure 14:
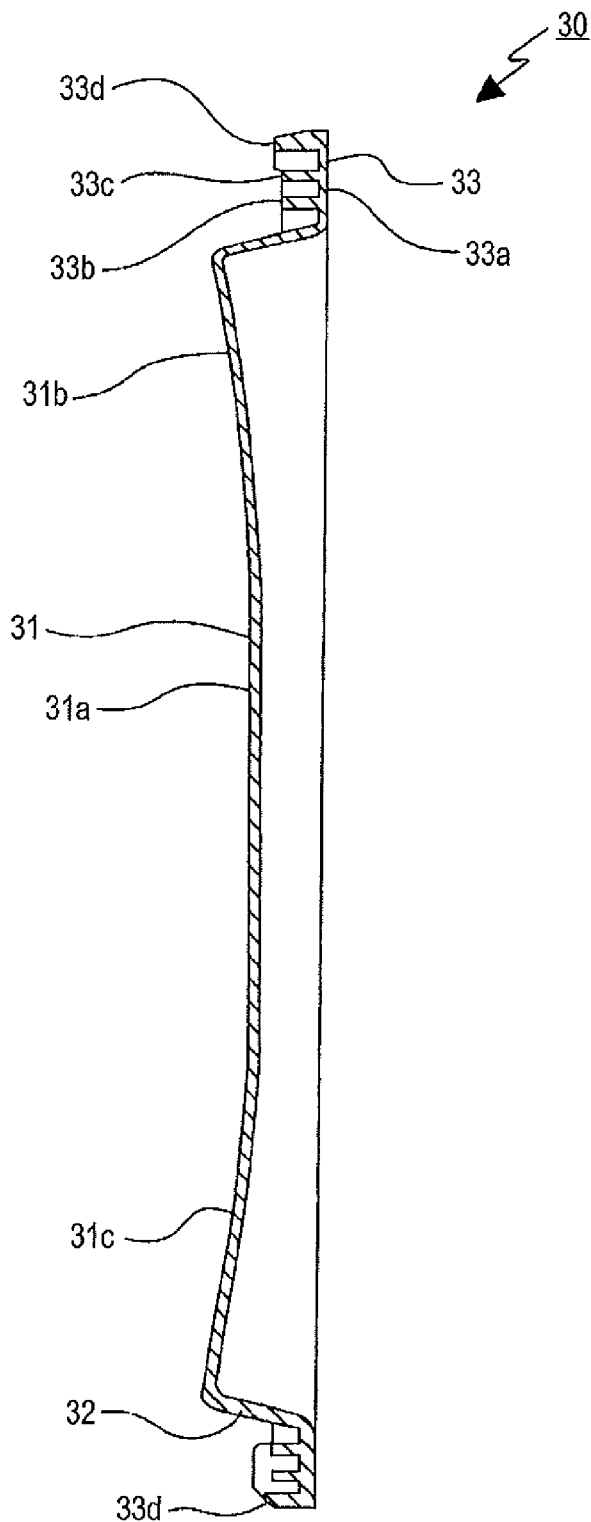
FIG. 14 is an enlarged cross-sectional view of the operation unit cover.

The lid body 3 is provided with an operation unit cover 30 (refer to FIG. 4). The operation unit cover 30 is made of transparent or semitransparent rubber materials such as silicon rubber. The operation unit cover 30 includes a front surface portion 31 formed to have an approximately rectangular shape in portrait orientation, a circumferential surface portion 32 rising from an outer circumferential edge of the front surface portion 31 to the backward direction and a flange portion 33 projecting outward from a back edge of the circumferential surface portion 32, which are integrally formed as shown in FIG. 13 and FIG. 14.

A portion of approximately one-third of the front surface portion 31 positioned at the center in the vertical direction is provided as a holding surface portion 31a having a flat-plate shape facing the front and the back, and portions positioned above and below the holding surface portion 31a are provided as inclined surface portions 31b, 31c gradually inclined so as to be displaced forward as drawing away from the holding surface portion 31a.

The circumferential surface portion 32 is inclined so as to be gradually displaced to the outside as coming backward, and an outer periphery of the back edge is slightly larger than an outer periphery of the front edge.

The flange portion 33 includes a base portion 33a facing front and back directions, a ring-shaped inner protruding ridge 33b and an outer protruding ridge 33c respectively protruding forward from the base portion 33a, first to-be-attached protrusions 33d, 33d and second to-be-attached protrusions 33e, 33e, . . . respectively protruding forward from the base portion 33a. The inner protruding ridge 33b is positioned with a certain clearance with respect to the circumferential surface portion 32 outside the circumferential surface portion 32 and the outer protruding ridge 33c is positioned with a certain clearance with respect to the inner protruding ridge 33b outside the inner protruding ridge 33b. The first to-be-attached protrusions 33d, 33d are positioned above and below the outer protruding ridge 33c so as to apart from the outer protruding ridge 33c and extend in the right and left direction. The second to-be-attached protrusions 33e, 33e, . . . are positioned at right and left sides of the outer protruding ridge 33c so as to apart from the outer protruding ridge 33c and extend upward and downward.

Figure 15:
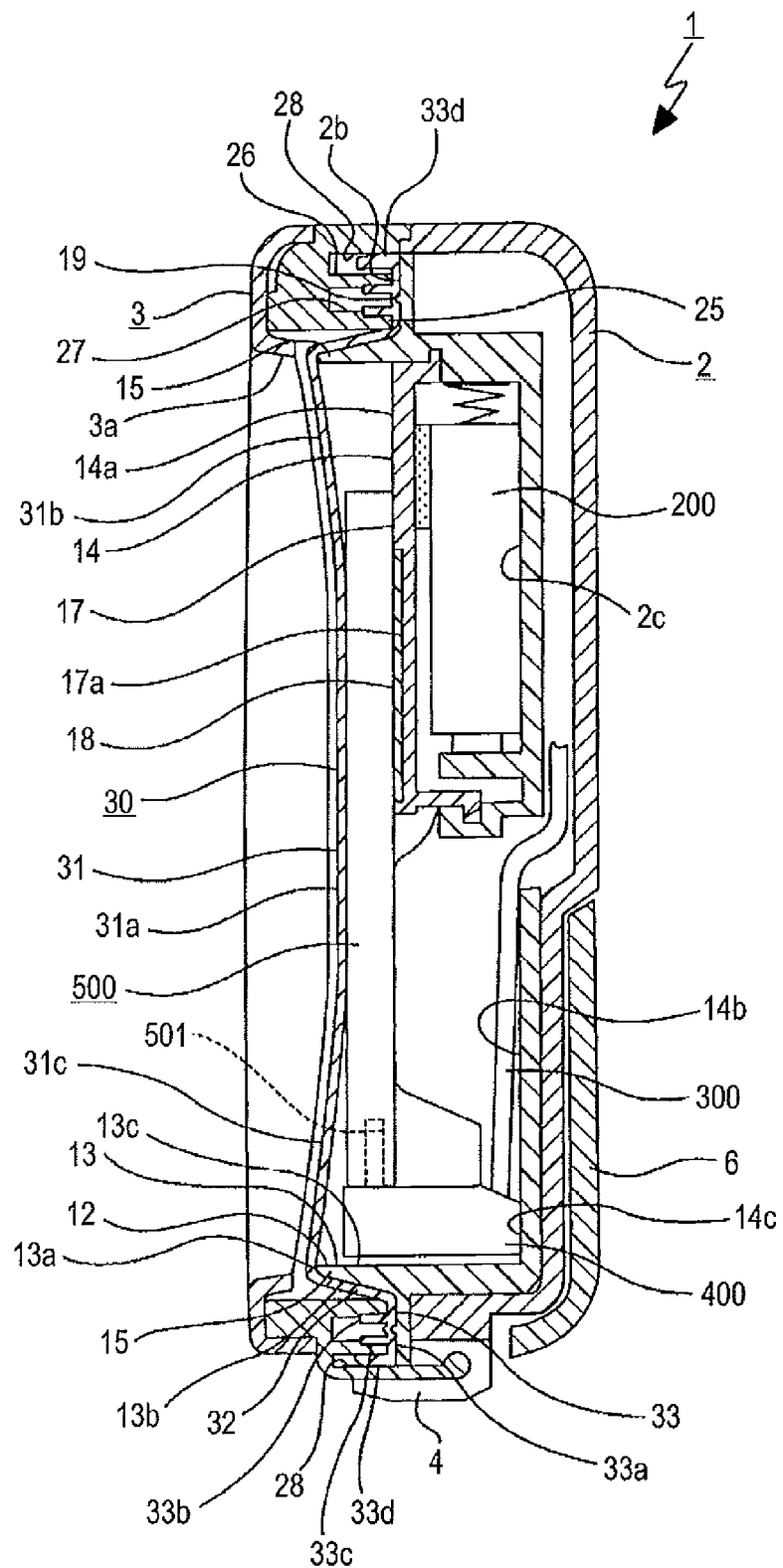
FIG. 15 is a cross-sectional view showing a state in which the lid body is pivoted to a closed position and the portable device is held by the operation unit cover.
Figure 16:
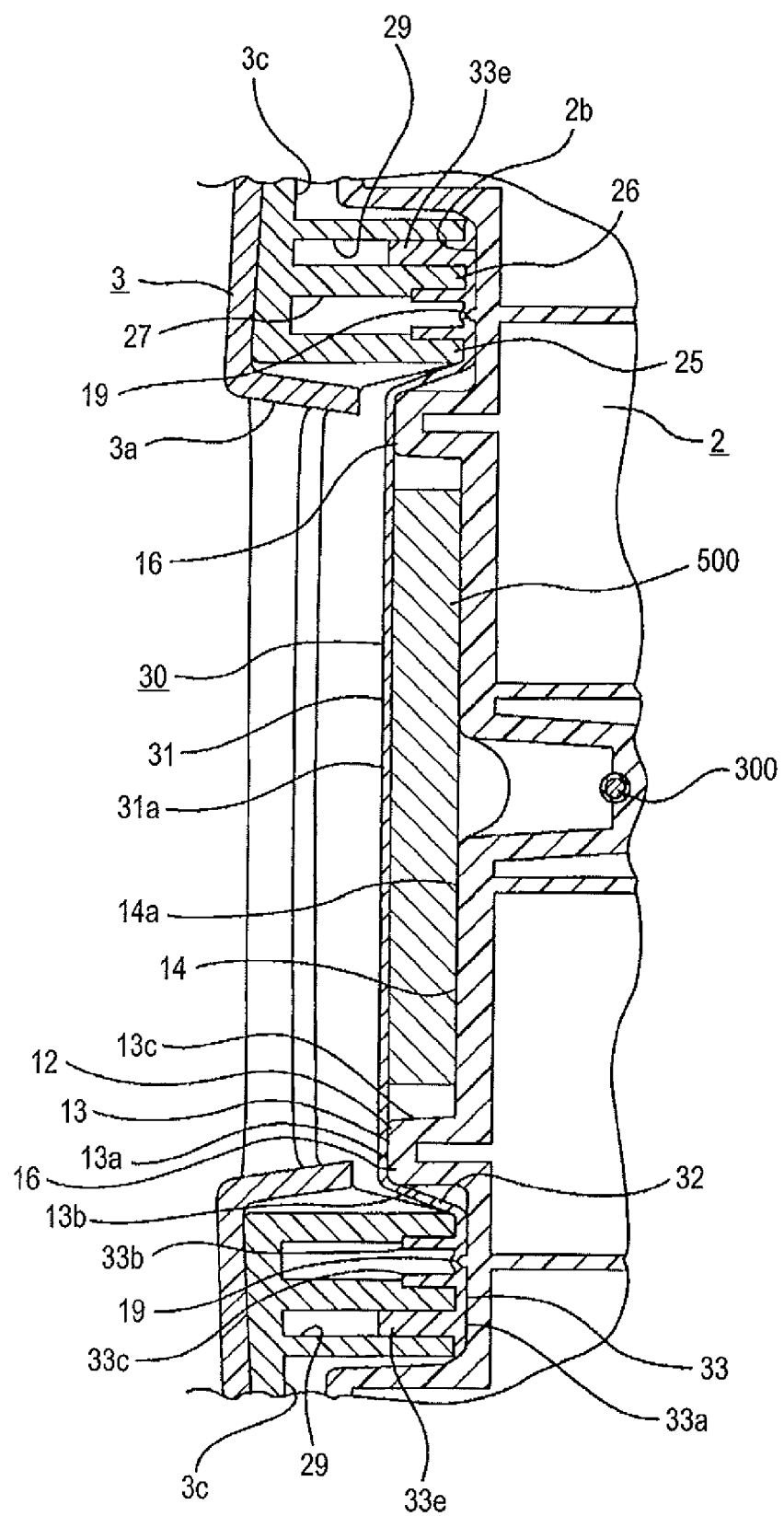
FIG. 16 is an enlarged cross-sectional view showing a state in which the portable device is held by the operation unit cover seen from a direction orthogonal to the view shown in FIG. 15.

The front surface portion 31 and the circumferential surface portion 32 are inserted to the operation unit cover 30 from the back surface side of the window portion 3a (refer to FIG. 15 and FIG. 16). The operation unit cover 30 is attached to the lid body 3 by fitting the inner protruding ridge 33b and the outer protruding ridge 33c to the holding groove 27, fitting the first to-be-attached protrusions 33d, 33d to the first attachment grooves 28, 28 respectively and fitting the second to-be-attached protrusions 33e, 33e, . . . to second attachment grooves 29, 29, . . . respectively.

<Open/Close Operation of the Lid Body>

Hereinafter, open/close operation of the lid body 3 will be explained.

Figure 17:
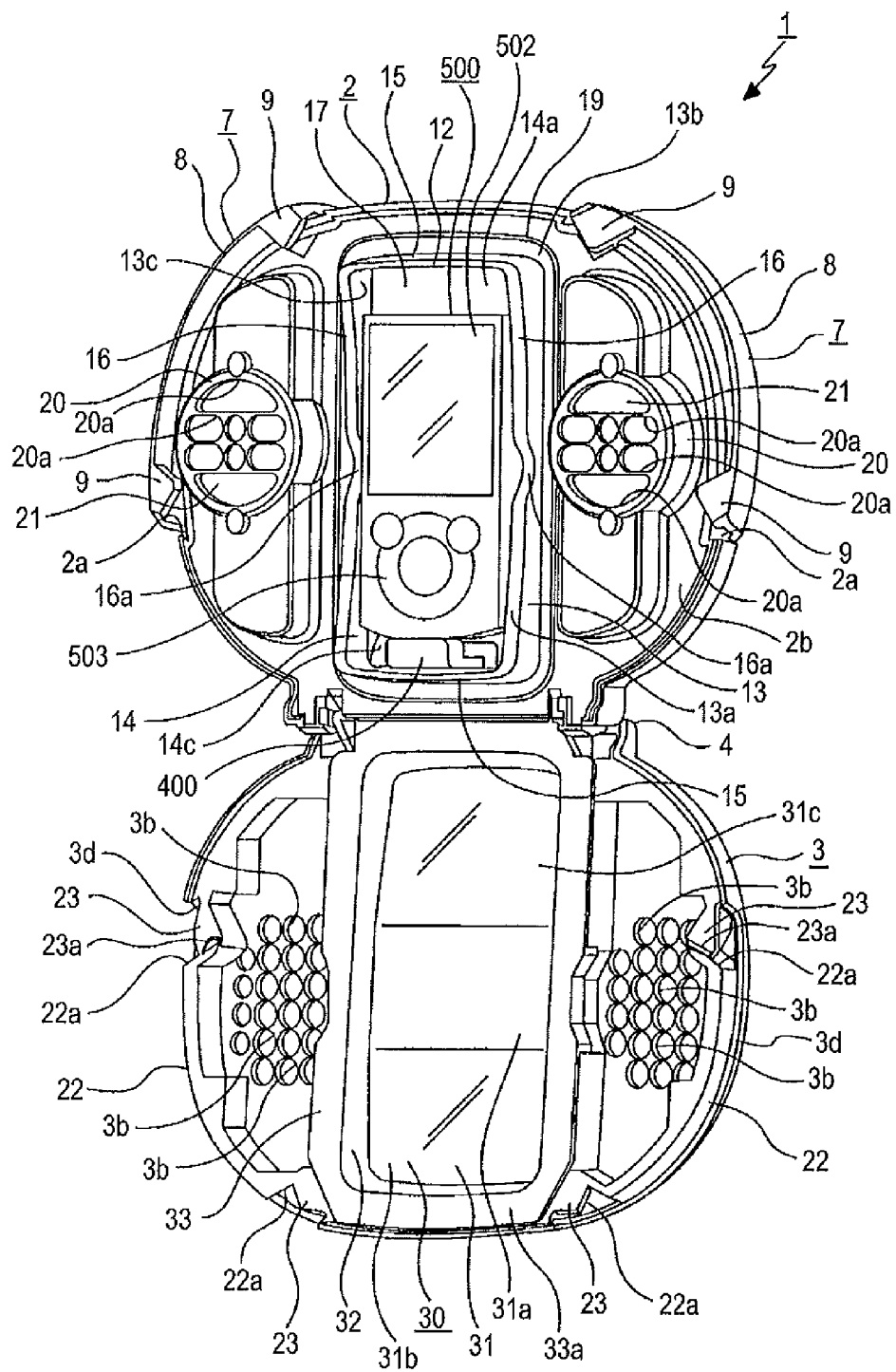
FIG. 17 is a perspective view showing a state in which the portable device connected to a connector is arranged in a housing recess.

When the lid body 3 is an opened state, the portable device 500 is inserted in the housing recess 14 of the housing portion 12 and arranged there (refer to FIG. 17). At the time of arranging the portable device 500 in the housing recess 14, the connector 400 is connected to the connection terminal portion 501. At this time, the connector 400 and the cable 300 can be pulled forward from the connector arrangement groove 14c and the cable arrangement groove 14b respectively as described above, therefore, the connector 400 can be connected to the connection terminal portion 501 easily.

The portable device 500 arranged in the housing recess 14 is placed on the placing surface 14a in a state in which a display surface 502 on which images and characters are displayed and an operation unit 503 for performing given operation face the front. In the state in which the portable device 500 is placed on the placing surface 14a, slipping of the portable device 500 is prevented by the nonslip sheet 18 attached to the battery rid 17, which allows the arrangement state of the portable device 500 to be stable.

In the opened position where the lid body 3 is opened, the buckles 7, 7 supported on the case body 2 are pivoted to the lock release position.

When the lid body 3 is pivoted about the hinge portion 4 to a closed position, the operation unit cover 30 is fitted onto the housing rib 13 of the case body 2 (refer to FIG. 15 and FIG. 16), and the housing recess 14 and the portable device 500 arranged in the housing recess 14 are closed by the operation unit cover 30.

In the state in which the operation unit cover 30 is fitted onto the housing rib 13, the outer periphery of the front surface portion 31 is positioned so as to abut on or close to the edge surface 13a of the housing rib 13 and the circumferential surface portion 32 is positioned so as to abut on or close to the outer peripheral surface 13b of the housing rib 13.

The flange portion 33 of the operation unit cover 30 is in a state in which a back surface of the base portion 33a of the flange portion 33 is pressed on the front surface 2b of the case body 2. At this time, a portion between the inner protruding ridge 33b and the outer protruding ridge 33c of the base portion 33a of the flange portion 33 is pressed on the waterproof rib 19, which gives waterproof property of the housing recess 14.

In the state in which the lid body 3 is pivoted to be in the closed position, the portable device 500 is held by portions other than part of the front surface portion 31 of the operation unit cover 30, for example, by the holding surface portion 31a or by the holding surface portion 31a and part of the inclined surface portions 31b, 31c (refer to FIG. 15).

In the output device 1, the size of the housing portion 12 is prescribed to a fixed size by the housing rib 13 and the operation unit cover 30 is formed in a box shape having the front surface portion 31 and the circumferential surface portion 32 so as to correspond to the size and shape of the housing rib 13. Accordingly, the housing portion 12 and the window portion 3a of the lid body 3 are formed to have the minimum size, which realizes miniaturization of the output device 1.

As the housing rib 13 protruding forward from the front surface 2b is provided in the housing unit 12, for example, infiltration of moisture to the housing recess 14 occurring when moisture is attached to the front surface 2b can be prevented, which improves waterproof property.

Furthermore, when the position of the portable device 500 housed in the housing recess 14 is moved due to the shock, vibration and so on, the moved portable device 500 abuts against the housing rib 13 and the movement is restricted. Therefore, the state in which the portable device 500 is held on the front surface portion 31 of the operation unit cover 30 can be maintained even when the shock, vibration and so on occur.

When the lid body 3 is pivoted toward the closed position, the buckles 7, 7 easily pivot from the locked position to the lock release position due to the own weight as described above, therefore, the buckles 7, 7 are held in the lock release position except in the state in which the case body 2 is in a certain posture (refer to FIG. 4).

When the lid body 3 is pivoted from the opened position to the closed position, the locking claws 9, 9 . . . of the buckles 7, 7 are inserted to the clearance cutouts 22*a*, 22*a*, . . . formed at the engaging portions 22, 22 of the lid body 3. Therefore, smooth pivoting operation of the lid body 3 can be secured while the lid body 3 does not touch the buckles 7, 7.

Figure 18:
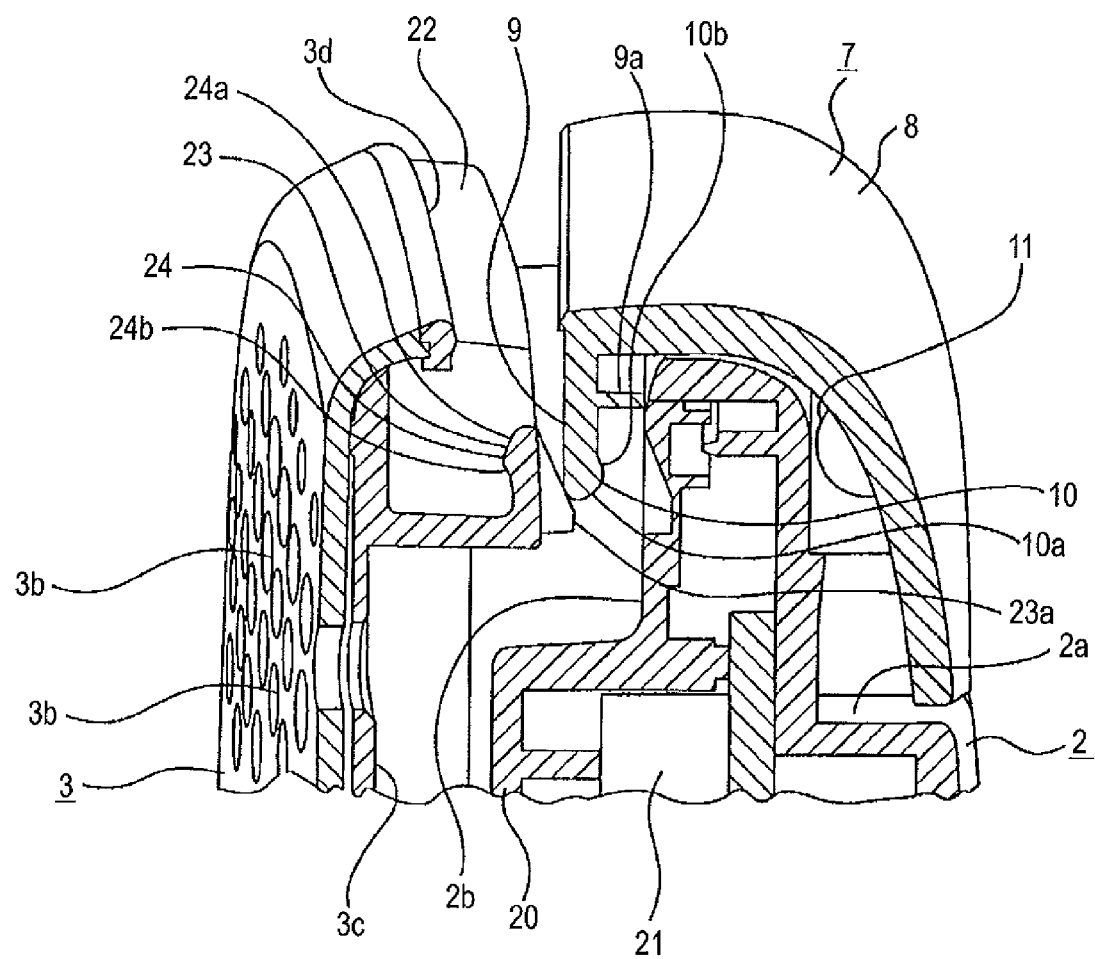
FIG. 18 is a cross-sectional view showing a state in which the lid body is pivoted from the opened position to the closed position and an operation rib touches a locking claw in a state in which the buckle is in the locked position.
Figure 19:
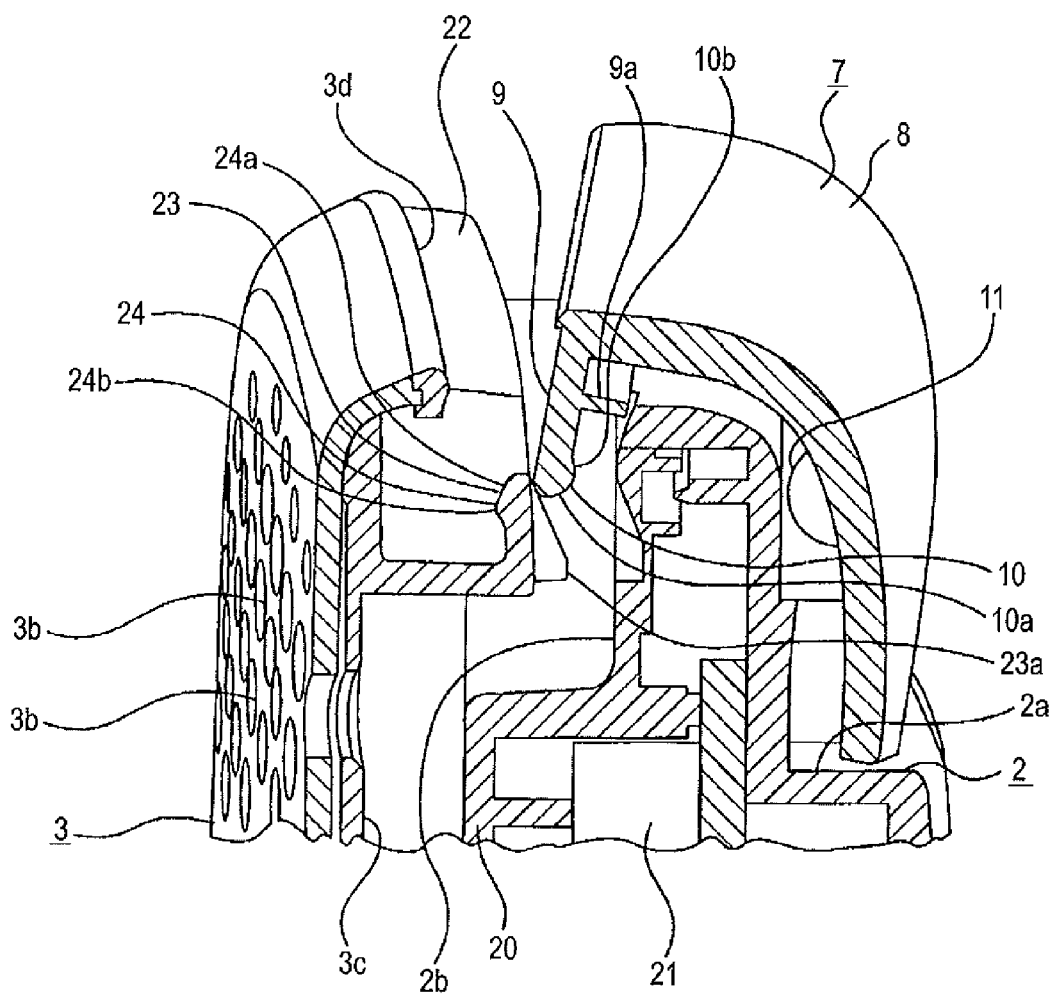
FIG. 19 is a cross-sectional view showing a state in which the buckle is being pivoted from the locked position to the lock release position by the operation rib.
Figure 20:
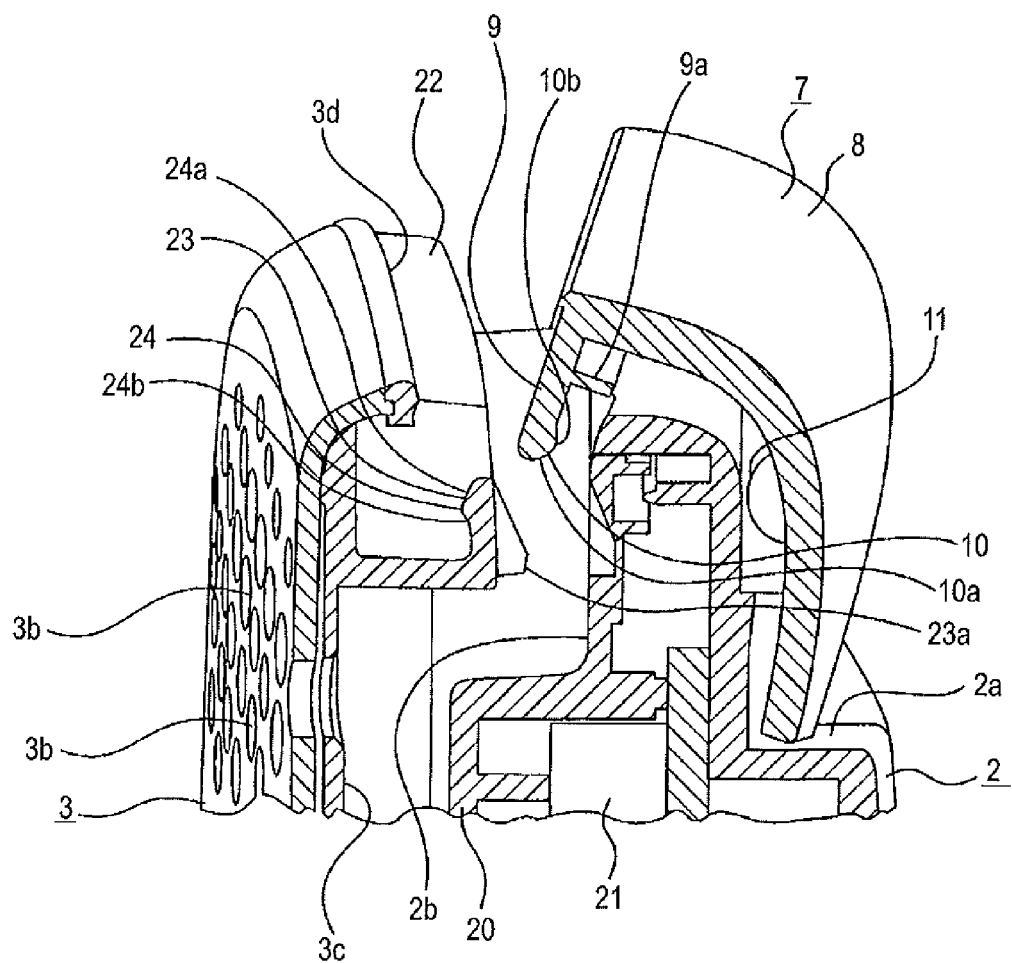
FIG. 20 is a cross-sectional view showing a state in which the buckle is pivoted to the lock release position by the operation rib.

When the case body 2 is in a certain posture, at least one of the buckles 7, 7 may be positioned in the locked position, however, the buckle 7 is pivoted from the locked position to the lock release position by the following operation (refer to FIG. 18 to FIG. 20).

When the lid body 3 is pivoted from the opened position to the closed position in the state in which the buckle 7 is in the locked position, the operation rib 23*a* provided at the to-be-locked piece 23 of the lid body 3 touches a tip edge of the locking claw 9 of the buckle 7 (refer to FIG. 18).

As the operation rib 23*a* is formed in the approximately triangular shape in which the protrusion amount thereof is increased as coming inside, the tip edge of the locking claw 9 makes sliding contact with the operation rib 23*a* to be pivoted to the lock release position when the lid body 3 is further pivoted from the opened position to the closed position (refer to FIG. 19).

When the lid body 3 is further pivoted from the opened position to the closed position, the lid body 3 reaches the closed position, the tip edge of the locking claw 9 draws apart from the operation rib 23*a* and the buckle 7 is pivoted to the lock release position (refer to FIG. 20).

As described above, even when the buckle 7 is in the locked position, the buckle 7 is pivoted to the lock release position due to the operation rib 23*a* as the lid body 3 is pivoted from the opened position to the closed position, therefore, smooth pivoting operation of the lid body 3 can be secured.

When the buckles 7, 7 are pivoted from the lock release position to the locked position in the state in which the lid body 3 is pivoted to the closed position, the lid body is locked with respect to the case body 2 in the closed position as explained below (refer to FIG. 21 to FIG. 23).

Figure 21:
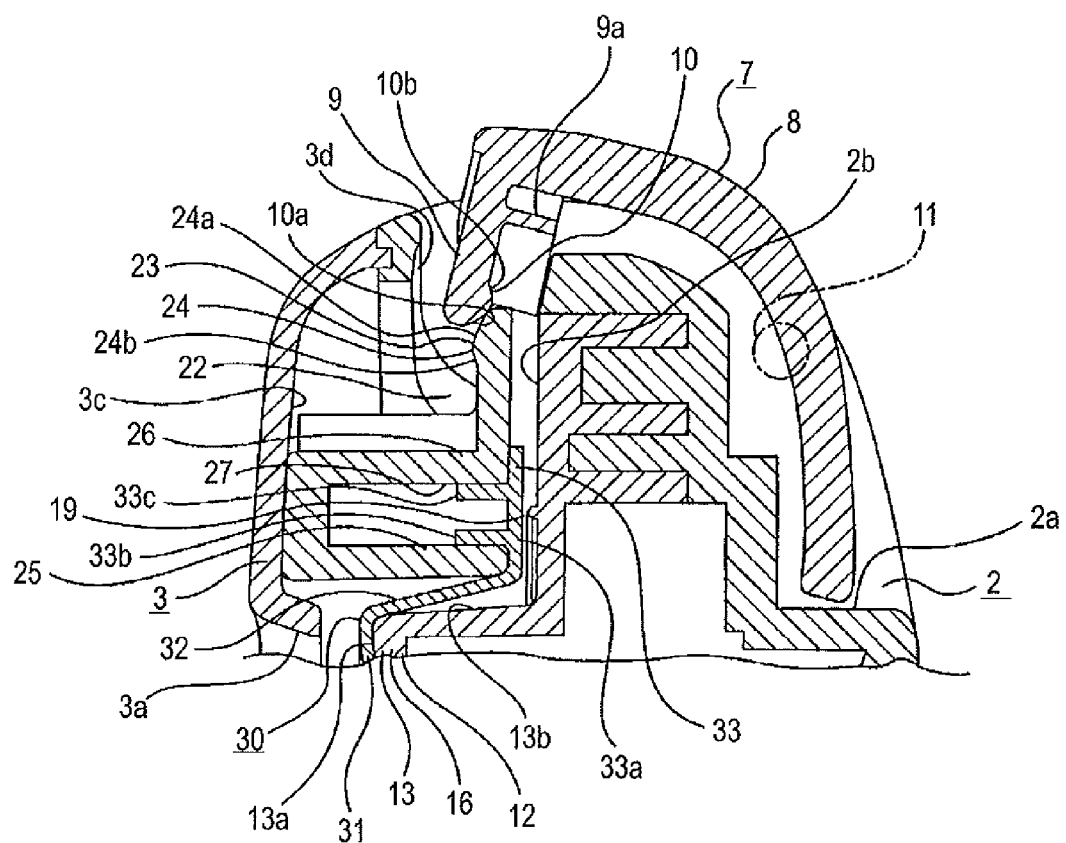
FIG. 21 is a cross-sectional view showing a state in which the lid body is pivoted from the opened position to the closed position and a first inclined surface of a locking protrusion touches a first inclined surface of a to-be-locked protrusion.

As the buckle 7 is pivoted from the lock release position toward the locked position, the first inclined surface 10*a* of the locking protrusion 10 provided at the locking claw 9 of the buckle 7 touches the first inclined surface 24*a* of the to-be-locked protrusion 24 provided at the to-be-locked piece 23 of the lid body 3 (refer to FIG. 21).

Figure 22:
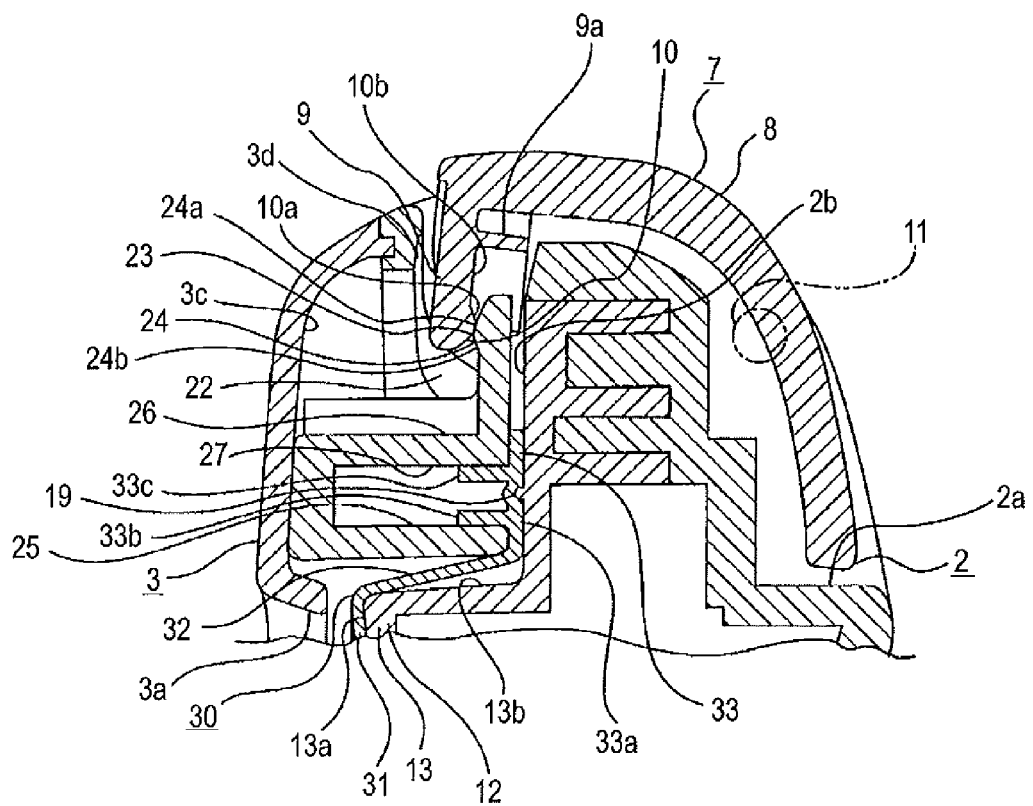
FIG. 22 is a cross-sectional view showing a state in which the lid body is further pivoted from the opened position to the closed position, the locking claw and a to-be-locked piece are elastically deformed and the locking claw climbs over the to-be-locked piece.

When the buckle 7 is further pivoted toward the locked position, the first inclined surface 10*a* of the locking protrusion 10 makes sliding contact with the first inclined surface 24*a* of the to-be-locked protrusion 24, and the locking claw 9 and the to-be-locked piece 23 are elastically deformed, as a result, the locking claw 9 climbs over the to-be-locked piece 23 (refer to FIG. 22).

Figure 23:
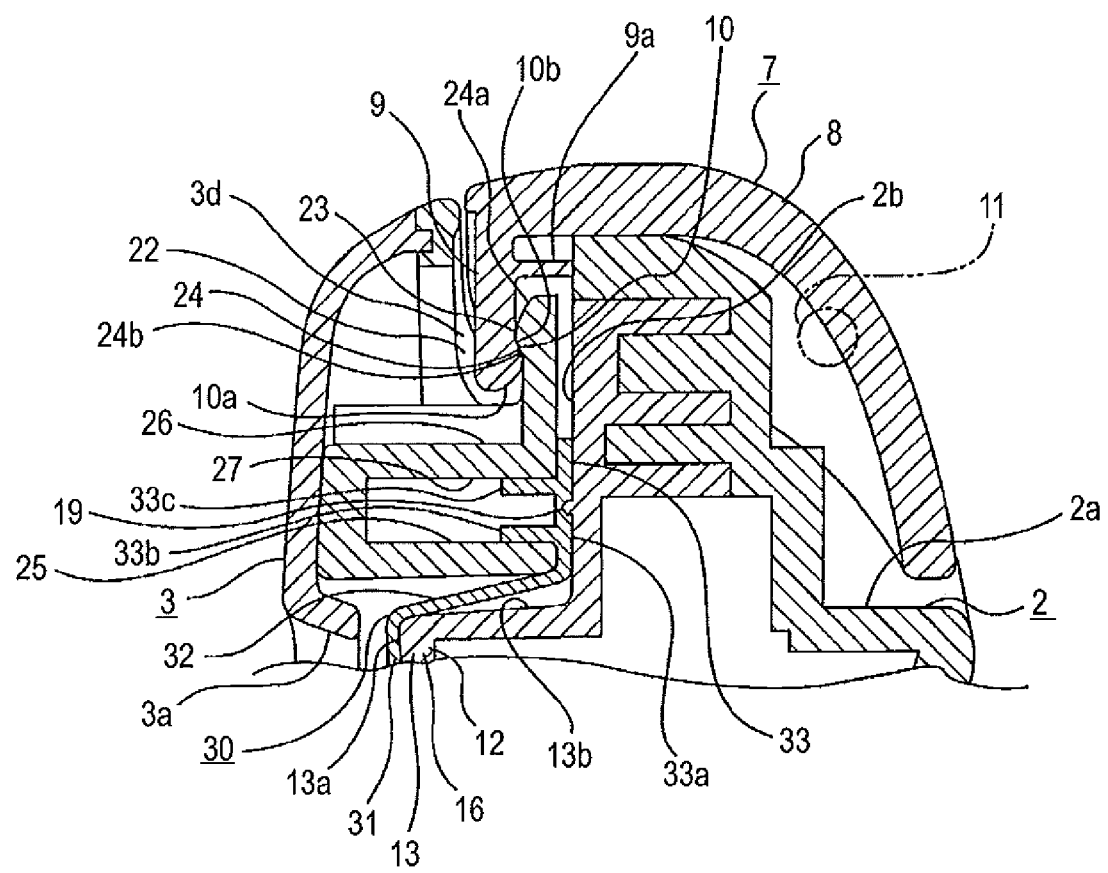
FIG. 23 is a cross-sectional view showing a state in which the locking claw and the to-be-locked piece are elastically returned and the lid body is locked with respect to the case body.

When the buckle 7 is further pivoted toward the locked position, the second inclined surface 10*b* of the locking protrusion 10 makes sliding contact with the second inclined surface 24*b* of the to-be-locked protrusion 24, and the locking claw 9 and the to-be-locked piece 23 are elastically returned, as a result, the second inclined surface 10*b* of the locking protrusion 10 is engaged with the second inclined surface 24*b* of the to-be-locked protrusion 24 (refer to FIG. 23). The second inclined surface 10*b* of the locking protrusion 10 is engaged with the second inclined surface 24*b* of the to-be-locked protrusion 24, thereby allowing the buckle 7 to be in the locked position and allowing the lid body 3 to be locked with respect to the case body 2.

In the state in which the lid body 3 is locked with respect to the case body 2, respective tip surfaces of the reinforcing ribs 9*a*, 9*a*, . . . provided at the locking claws 9, 9, . . . touches the front surface 2*b* of the case body 2. Therefore, deformation or damage of the locking claws 9, 9, . . . to be given when the shock is added to the lid body 3, the case body 2 or the buckles 7, 7 can be prevented as well as the stable locked state of the lid body 3 with respect to the case body 2 can be secured.

As described above, when the lid body 3 is locked with respect to the case body 2, the flange portion 33 of the operation unit cover 30 is pressed onto the portion around the housing rib 13 on the front surface 2*b* of the case body 2, which secures good waterproof property with respect to the housing portion 12.

Figure 24:
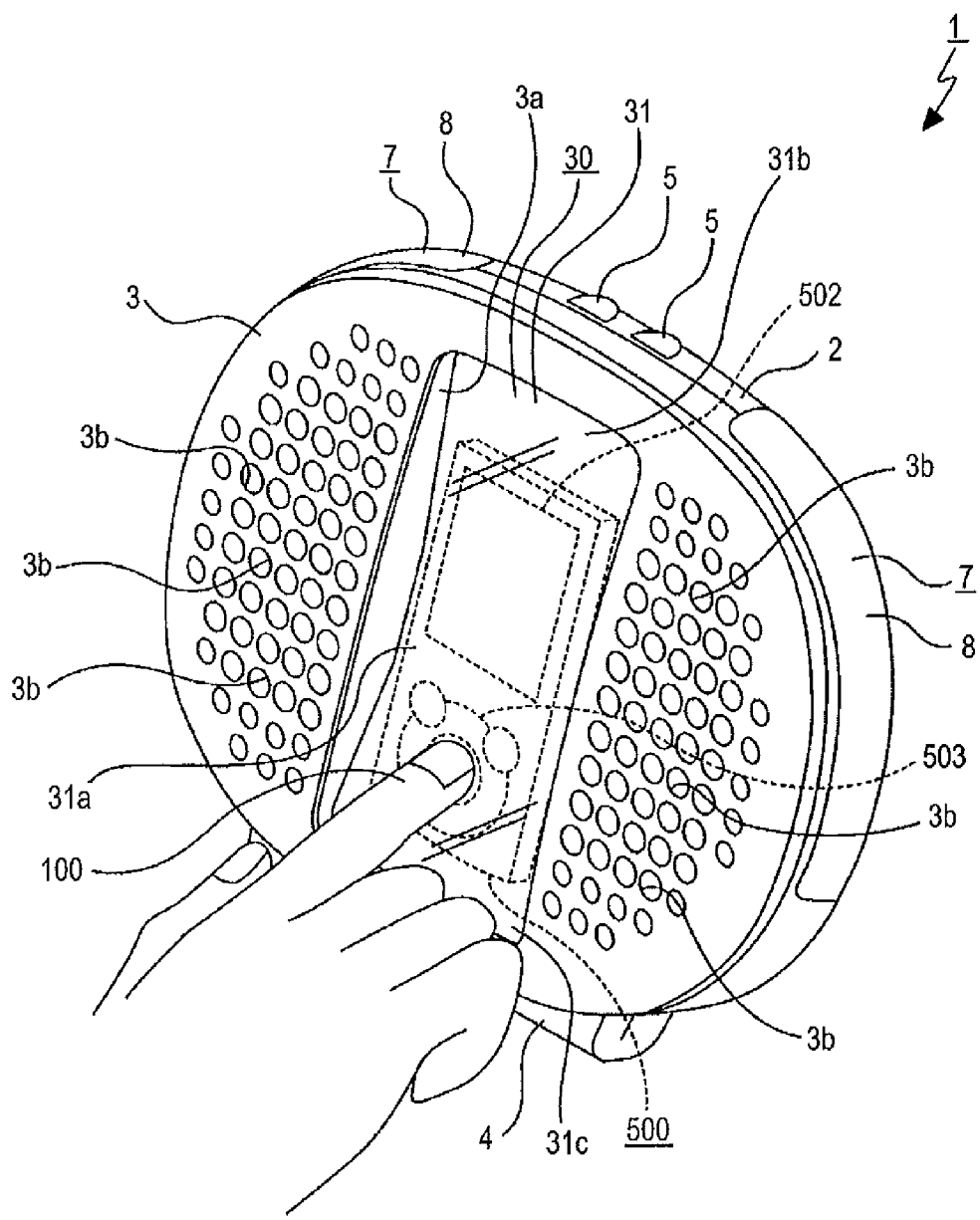
FIG. 24 is a perspective view showing a state in which an operation unit of the portable device is operated from the outside of the operation unit cover.

In the state in which the lid body 3 is locked with respect to the case body 2, operation is performed by a finger 100 with respect to the operation unit 503 of the portable device 500 which is pressed onto the placing surface 14*a* of the housing recess 14 by the operation unit cover 30 (refer to FIG. 24). When the operation is performed with respect to the operation unit 503 of the portable device 500, for example, audio output from the portable device 500 is transmitted to the speakers 21, 21 through the connector 400, as a result, audio is outputted from the speakers 21, 21. The audio outputted from the speakers 21, 21 is outputted to the outside through the output holes 20*a*, 20*a*, . . . formed in the speaker arrangement portions 20, 20 of the case body 2 and the audio output holes 3*b*, 3*b*, . . . formed in the lid body 3.

Additionally, images displayed (outputted) on the display surface 502 of the portable device 500 are transmitted through the front surface portion 31 of the operation unit cover 30 and outputted to the outside.

In the state in which the lid body 3 is locked with respect to the case body 2, the lock of the lid body 3 with respect to the case body 2 is released by pivoting the buckles 7, 7 from the locked position to the lock release position.

Figure 10:
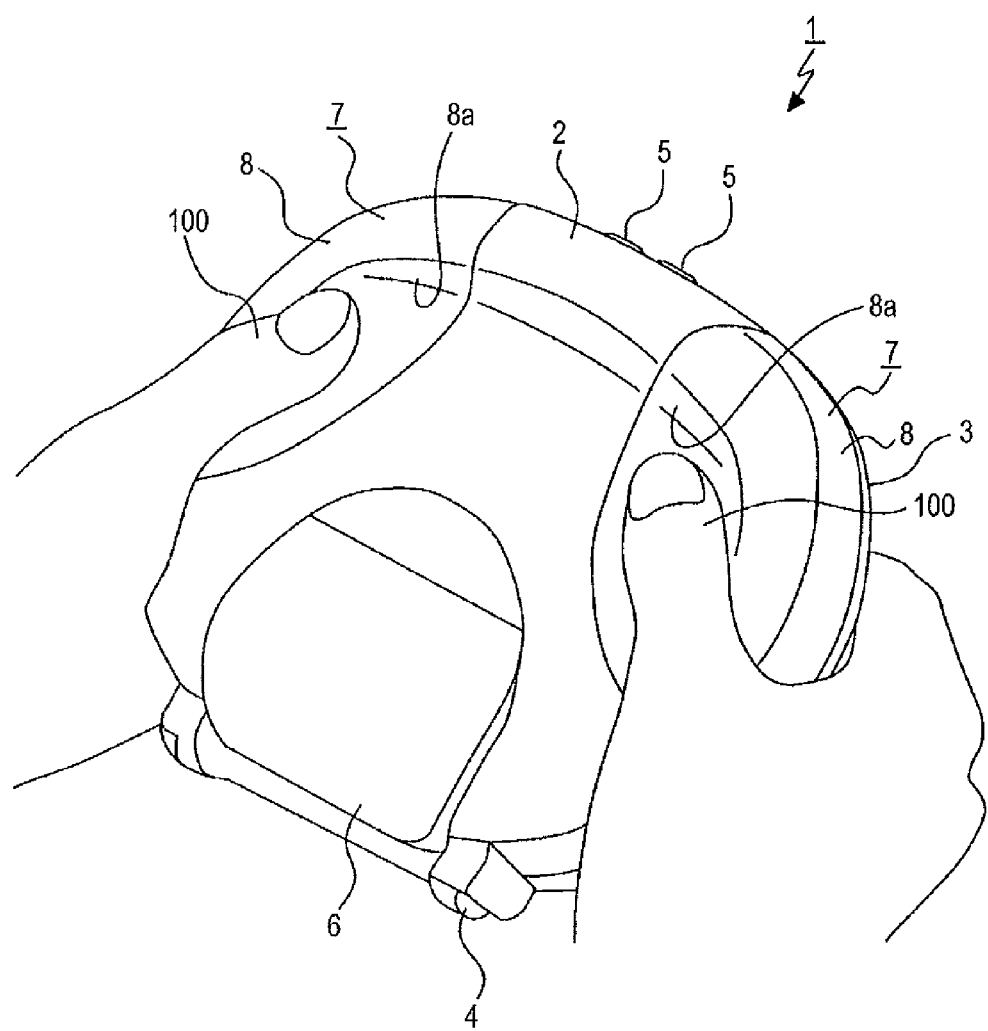
FIG. 10 is a perspective view in a state of operating the buckles.

At this time, the buckles 7, 7 can be pivoted from the locked position to the lock release position as shown in FIG. 10 by pressing the grasping recesses 8*a*, 8*a* of the buckles 7, 7 toward the front direction by the user.

As the grasping recesses 8*a*, 8*a* are formed in the buckles 7, 7 respectively, holding of the output device 1 and operation with respect to the buckles 7, 7 by the user are easily performed, which can improve user-friendliness of the output device 1.

The pivoting operation from the locked position to the lock release position of the buckle 7 is a reverse operation to the pivoting operation from the lock release position to the locked position. That is, the release of the lock of the lid body 3 with respect to the case body 2 is performed in the manner in which the buckle 7 is pivoted from the locked position to the lock release position, the locking claw 9 and the to-be-locked piece 23 are elastically deformed and the locking claw 9 climbs over the to-be-locked piece 23, then, the buckle 7 is further pivoted toward the lock release position and the locking claw 9 and the to-be-locked piece 23 are elastically returned.

The lid body 3 is pivoted from the closed position to the opened position in the state in which the lock of the lid body 3 with respect to the case body 2 is released, thereby removing the portable device 500 from the housing access 14.

The removal of the portable device 500 from the housing recess 14 can be easily performed by inserting two fingers into the housing recess 14 through the recesses for removal 16a, 16a formed in the second restriction walls 16, 16 of the housing rib 13 and holding the portable device 500 from right-and-left both sides.

The recesses for removal 16a, 16a are formed in the housing rib 13 as described above, therefore, the portable device 500 can be easily removed from the housing recess 14, which improves user-friendliness of the output device 1.

As described above, the lock of the lid body 3 with respect to the case body 2 can be performed and released by pivoting a pair of buckles 7, 7 in the output device 1. Therefore, the lock of the lid body 3 with respect to the case body 2 can be performed and released by a single operation using both hands, which improves user-friendliness of the output device 1.

As the case body 2 and the lid body 3 are connected by the hinge portion 4 and the lid body 3 is not separated from the case body 2 even in the state in which the lid body 3 is in the opened state, it is not necessary to perform the lock of the lid body 3 with respect to the case body 2 after positioning the lid body 3 to the case body 2, which can further improve user-friendliness.

Additionally, the locking claws 9, 9, . . . are provided at both end portions of the buckles 7, 7 respectively in the directions extending along the outer periphery, therefore, the locking claws 9, 9, . . . of the buckles 7, 7 are engaged with the to-be-locked pieces 23, 23 of the lid body 3 at a total of four points which are apart from one another in the circumferential direction of the case body 2.

Consequently, the locking state of the lid body 3 with respect to the case body 2 can be stabilized as well as good waterproof property can be secured.

<Others>

In the above description, the structure in which a pair of buckles 7, 7 is pivotally supported at the case body 2 and the engaging portions 22, 22 to be engaged with the buckles 7, 7 are provided at the lid body 3 has been shown, however, a structure in which a pair of buckles are pivotally supported at the at the lid body and engaging portions to be engaged with the buckles are provided at the case body can be also applied in an opposite manner.

It goes without saying that the above "waterproof" includes everyday waterproof and drip-proof.

Specific shapes and structures of respective units shown in the above embodiment are just examples in the embodiment for carrying out the present disclosure, and the technical scope of the present disclosure should not be interpreted in a limited manner.

It should be understood by those skilled in the art that various modifications, combinations, sub-combinations and alterations may occur depending on design requirements and other factors insofar as they are within the scope of the appended claims or the equivalents thereof.

What is claimed is:

1. An output device which houses a portable device in an internal space and which outputs at least audio or images outputted from the housed portable device to the outside, comprising:
   a case body including a housing portion housing the portable device;
   a lid body connected to the case body so as to pivot about a hinge portion and pivoted between an opened position in which the housing portion of the case body is opened and a closed position in which the housing portion of the case body is closed;
   a pair of buckles pivotally supported at one outer peripheral portion of the case body or the lid body between a locked position and a lock release position as well as pivoted to the locked position when the lid body is pivoted to the closed position to thereby lock the lid body with respect to the case body, wherein the internal space formed by the lid body and the case body is waterproofed in a state in which the lid body is pivoted to the closed position and the lid body is locked with respect to the case body by the pair of buckles;
   a pair of engaging portions to which the pair of buckles pivoted to the locked position are respectively engaged provided at another outer peripheral portion of the case body or the lid body, wherein
      outer peripheries of the pair of buckles are formed to have a curved shape, and
      the pair of buckles supported at the case body or the lid body and the pair of engaging portions provided at the case body or the lid body are arranged at opposite positions so as to sandwich the housing portion;
   one or more locking claws provided at end portion of each buckle of the pair of buckles;
   one or more to be locked pieces provided on each engaging portion of the pair of engaging portions, wherein the one or more to be locked pieces and the one or more locking claws are arranged at opposite positions such that each locking claw is allowed to engage with a corresponding to be locked piece; and
   an operation rib provided on each of the one or more to be locked pieces, wherein the operation rib of each of the one or more to be locked pieces touches an opposite locking claw of a corresponding buckle when the lid body is pivoted from the opened position to the closed position to lock the buckle, and the operation rib of each of the one or more to be locked pieces makes sliding contact with the opposite locking claw of the corresponding buckle when the lid body is pivoted from the closed position to the open position to release the buckle from lock position.

2. The output device according to claim 1, wherein each buckle of the pair of buckles is provided with two locking claws, each engaging portion of the pair of engaging portions is provided with two to-be-locked pieces to which the two locking claws are engaged, and the two locking claws of each buckle are provided at both end portions of each buckle in a direction extending along outer periphery of each buckle.

3. The output device according to claim 1, wherein the pair of buckles is held in the lock release position when a lock of the lid body with respect to the case body is released.

4. The output device according to claim 1, wherein a grasping recess is formed in each pair of buckles, and wherein the pair of buckles is pivoted from the locked position to the lock release position by pressing the grasping recess.

* * * * *